(12) United States Patent
Roy et al.

(10) Patent No.: US 10,651,014 B2
(45) Date of Patent: May 12, 2020

(54) COMPACT PORTABLE PLASMA REACTOR

(71) Applicant: SURFPLASMA, INC., Gainesville, FL (US)

(72) Inventors: Subrata Roy, Gainesville, FL (US); Sherlie Eileen Portugal Atencio, Doral, FL (US)

(73) Assignee: SURFPLASMA, INC., Gainesville, FL (US)

( * ) Notice: Subject to any disclaimer, the term of this patent is extended or adjusted under 35 U.S.C. 154(b) by 0 days.

(21) Appl. No.: 16/235,492

(22) Filed: Dec. 28, 2018

(65) Prior Publication Data

US 2019/0206658 A1    Jul. 4, 2019

Related U.S. Application Data

(60) Provisional application No. 62/612,027, filed on Dec. 29, 2017.

(51) Int. Cl.
| | | |
|---|---|---|
| *H01J 37/32* | (2006.01) | |
| *H05H 1/24* | (2006.01) | |
| *H05H 1/46* | (2006.01) | |

(52) U.S. Cl.
CPC .... *H01J 37/32348* (2013.01); *H01J 37/3255* (2013.01); *H01J 37/3277* (2013.01);
(Continued)

(58) Field of Classification Search
CPC ........... H01J 37/32348; H01J 37/32192; H01J 37/3255; H01J 37/3277; H05H 1/2406; H05H 2001/4682; H05H 2245/121
See application file for complete search history.

(56) References Cited

U.S. PATENT DOCUMENTS 5,847,941 A * 12/1998 Taguchi .................. H02M 1/34
363/21.03
5,991,171 A * 11/1999 Cheng ............... H02M 3/33507
363/21.03
(Continued)

OTHER PUBLICATIONS

Gertzou, Ioanna N. et al., "Combined effect of ozonation and packaging on shelf life extension of fresh chicken legs during storage under refrigeration," J Food Sci Tech 53:4270-4277, Dec. 2016.
(Continued)

*Primary Examiner* — Emily P Pham
(74) *Attorney, Agent, or Firm* — Saliwanchik, Lloyd & Eisenschenk

(57) ABSTRACT

Embodiments of the subject invention relate to a small modular self-contained surface plasma device for decontamination of air and surfaces within enclosed volumes. Embodiments of the subject invention relate to a method and apparatus using the technical process of dielectric barrier discharge (DBD) surface plasma generation from ambient atmosphere for decontamination of air and surfaces within enclosed volumes. The primary application mode is for preservation of perishable commodities within industrial shipping containers through reduction of surface spoilage organisms and destruction of evolved gaseous ethylene that causes premature ripening. Additional implementations include deployment for oxidation of surfaces and/or container atmospheres in applications to diminish or eradicate pesticides, toxins, chemical residues, and other natural or introduced contaminants. Other embodiments envisioned include incorporation of device capabilities and or ancillary modules for feedback input (e.g. ozone sensor(s) to maintain steady state levels, self-tuning circuitry to adjust operating frequency), communication (e.g. among modules, RFID
(Continued)

data loggers, Wi-Fi output), and programing (e.g. user input of container volume, transit time, ozone level, etc.).

18 Claims, 19 Drawing Sheets

(52) U.S. Cl.
CPC ..... *H01J 37/32192* (2013.01); *H05H 1/2406* (2013.01); *H05H 2001/4682* (2013.01); *H05H 2245/121* (2013.01)

(56) References Cited

U.S. PATENT DOCUMENTS

| | | | | |
|---|---|---|---|---|
| 7,113,413 | B1* | 9/2006 | Khasiev | H02M 3/335 323/222 |
| 8,368,362 | B2* | 2/2013 | Liu | H02M 3/155 323/225 |
| 10,164,539 | B1* | 12/2018 | Peng | H02M 3/33592 |
| 2014/0346875 | A1* | 11/2014 | Chinga | H02M 7/53803 307/31 |

OTHER PUBLICATIONS

Glowacz, Marcin., Rees, Deborah., "Exposure to ozone reduces postharvest quality loss in red and green chili peppers," Food Chem 210:305-310, Apr. 2016.

Glowacz, Marcin., Rees, Deborag., "The practicality of using ozone with fruit and vegetables," J Sci Food Agric. 96:4637-43, May 12, 2016.

Mancinelli, Rocco L., McKay, Christopher P., "Effects of nitric oxide and nitrogen dioxide on bacterial growth," Appl Environ Microbiol 46:198-202, Jul. 1983.

Mastanaiah, Navya., Johnson, Judith .A., Roy, Subrata., "Effect of Dielectric and Liquid on Plasma Sterilization using Dielectric Barrier Discharge Plasma," PLoS One 8(8):e70840, Aug. 2013.

Mastanaiah, Navya., Banerjee, Poulomi., Johnson, Judith A., Roy, Subrata., "Examining the role of Ozone in Surface Plasma Sterilization using Dielectric Barrier Discharge Plasma," Plasma Process Polymers (Cover Article) 10:1120-1133, 2013.

Swami, Saurabh et al., "Evaluation of ozonation technique for pesticide residue removal and its effect on ascorbic acid, cyaniding-3-glucoside, and polyphenols in apple (*Malus domesticus*) fruits," Environ Monit Assess. 188:301, 2016.

Zelaya, Anna J. et al., "Pseudomonas aeruginosa Biofilm inactivation: Decreased cell culturability, adhesiveness to surfaces, and biofilm thickness upon high-pressure nonthermal plasma treatment," IEEE Trans Plasma Sci IEEE Nucl Plasma Sci Soc. 38:3398-3403, Dec. 2010.

\* cited by examiner

COMPACT PORTABLE PLASMA REACTOR

CROSS-REFERENCE TO RELATED APPLICATIONS

This application claims the priority benefit of U.S. Provisional Application Ser. No. 62/612,027, filed Dec. 29, 2017, which is incorporated herein by reference in its entirety.

FIELD OF INVENTION

Embodiments relate to a Compact Plasma Reactor (CPR) apparatus and related method. Use of embodiments of the subject CPR and related method can reduce the 12% food waste that occurs annually during the transportation and distribution of perishable products.

BACKGROUND OF INVENTION

Power supply units that drive dielectric barrier discharge devices like plasma actuators and plasma sterilization devices are heavy and bulky weighing several kilograms occupying several square feet of footprint.

According to a 2012 National Resource Defense Council report, forty percent of food in the United States today goes uneaten, representing the equivalent of $165 billion in wasted food each year. Reducing food losses by just 15 percent would be enough food to feed more than 25 million Americans every year at a time when one in six Americans lack a secure supply of food to their tables. Handling issues can occur when perishable commodities experience improper temperatures, such as during transportation delays due to weather, traffic, equipment or vehicle malfunction, or due to congestion at harbors, terminals, or when on loading docks or in warehouses. Imported products can wait days at ports for testing, significantly reducing their shelf life. Industry economic impacts from longer shelf life throughout the distribution chain could be significant to improved industry gross margins and net revenue. Other economic ramifications include job creation, lower health care costs through higher quality and availability of perishables, reduced environmental impacts, and a more productive populace.

Ozone, a major component of atmospheric plasma, is a potent antimicrobial agent. Ozone destroys microorganisms by reacting with oxidizeable cellular components, particularly those containing double bonds, sulfhydryl groups, and phenolic rings. Therefore, membrane phospholipids, intracellular enzymes, and genomic material are targeted by ozone; these reactions result in cell damage and death of microorganisms. Ozone offers many advantages as a sterilant/disinfectant gas; ozone is a very efficient sterilant because of its strong oxidizing properties (E=2.076). It also breaks down to harmless oxygen after just a couple of hours, but is active for enough time to effectively kill viruses, bacteria, fungi, and parasites, including those causing food spoilage or human diseases. Efficacy of ozone, however, depends on the target microorganism and the treatment condition. Ozone has been used for sterilization of containers for aseptic packaging, decontamination of fresh produce, and food preservation in cold storage. Ozone is an unstable gas that must be produced on-site, since it cannot be stored, so it is not practical to use in many settings.

BRIEF SUMMARY

Embodiments of the subject invention relate to a small modular self-contained surface plasma device for decontamination of air and surfaces within enclosed volumes. Embodiments of the subject invention relate to a method and apparatus using the technical process of dielectric barrier discharge (DBD) surface plasma generation from ambient atmosphere for decontamination of air and surfaces within enclosed volumes. The primary application mode is for preservation of perishable commodities within industrial shipping containers through reduction of surface spoilage organisms and destruction of evolved gaseous ethylene that causes premature ripening. Additional implementations include deployment for oxidation of surfaces and/or container atmospheres in applications to diminish or eradicate pesticides, toxins, chemical residues, and other natural or introduced contaminants. Other embodiments envisioned include incorporation of device capabilities and or ancillary modules for feedback input (e.g. ozone sensor(s) to maintain steady state levels, self-tuning circuitry to adjust operating frequency), communication (e.g. among modules, RFID data loggers, Wi-Fi output), and programing (e.g. user input of container volume, transit time, ozone level, etc.).

An embodiment of the present invention decontaminates air and surfaces employing a lightweight, portable, modular, small, affordable, low power, low maintenance apparatus, which can be referred to as a Compact Plasma Reactor (CPR), via diffuse electrical plasma generated in atmospheric air. This is accomplished by applying a potential difference between two electrodes, separated by an insulating dielectric layer. It is well known that plasma has adverse effects on living organisms and degrades various chemicals. Ozone is a potent antimicrobial agent, effectively killing viruses, bacteria, fungi, and parasites. Ozone destroys microorganisms by reacting with oxidizeable cellular components, particularly those containing double bonds, sulfhydryl groups, and phenolic rings. Therefore, membrane phospholipids, intracellular enzymes, and genomic material are targeted by ozone; these reactions result in cell damage and death of microorganisms. Ozone offers many advantages as a sterilant gas due to strong oxidizing properties (E=2.076), but utilization is often not feasible or economical, especially in many transit applications, since it is not stable, cannot be stored and therefore must be generated in situ.

Embodiments of the subject invention have been used to demonstrate that this activity arises primarily from generation of ozone, although contributions from other reactive oxygen species, UV, and other mechanisms may be involved. Ozone naturally decomposes to produce oxygen with no residual chemical residues. Based on the mechanism of surface plasma-based DBD sterilization, and using empirical analyses, appropriate permutations of operational parameters for effective surface and atmospheric sterilization have been assessed. Embodiments of the subject invention relate to an CPR surface plasma-based ozone generator have properties as a flow actuator that induces a three-dimensional body force to mix ozone with neighboring air for rapid mixing and equalization of ozone levels within the container. Embodiments of the subject invention relate to a microscale portable power amplifier capable of generating plasma across a capacitive load, and can incorporate a switch-mode amplifier capable of producing high-voltage and high-frequency output for plasma generation.

Surface plasma decontamination affords a number of advantages over conventional decontamination methods that employ toxic compounds. Current practices involve use of chlorinating agents, organic acids, hydrogen peroxide or fumigating gases and other methods involving toxic materials and/or byproducts and can have adverse effects on perishable commodities.

A CPR can facilitate DBD surface plasma decontamination, which is rapid, e.g., taking only minutes for a 6-log reduction in viable levels of a multiplicity of human and plant pathogens. Unlike current procedures, including other plasma based methods for ozone production, surface plasma in accordance with the subject invention can be generated from ambient atmospheric air, such that no toxic materials are involved, and no high input of electricity or enriched gases is required. Since plasma is generated at atmospheric pressure and low temperatures, is non-corrosive and compatible with common environmental surfaces and delicate commodities, it can be used with surfaces and materials of different composition.

Embodiments of a Compact Plasma Reactor (CPR) can be incorporated into reusable fruit and vegetable shipping and storage containers, to harvest, transport, store, and distribute fruits and vegetables. Proper transport and handling of food is critical throughout the entire supply chain. Perishable products that require refrigeration have additional cost and traceability requirements. Handling issues can occur when produce experiences improper temperatures, such as during transportation delays due to weather, traffic, equipment or vehicle malfunction, or due to congestion at harbors, terminals, or when on loading docks or in warehouses. Imported products can wait days at the ports for testing, significantly reducing their shelf life.

Embodiments of the subject invention relate to a Compact Plasma Reactor (CPR) as small (~1 inch cube), having a modular self-contained battery powered unit designed to go inside a food container or "GreenBox" containing perishable produce to prevent or reduce losses due to spoilage. In addition to having a small size and minimal power requirements, advantages of the CPR include: no long-term toxic material used or produced, minimal carbon footprint, while utilizing aa method for protecting perishable items from spoilage during retail/storage/shipping in a container using surface plasma generated by the CPR where one or more CPRs can be placed in the tote at the point of origin and recycled or disposed by the end user at retail.

Embodiment of the invention relate to a method and apparatus using the technical process of dielectric barrier discharge (DBD) surface plasma generation from ambient atmosphere for decontamination of air and surfaces within enclosed volumes. The primary application mode is for preservation of perishable commodities through reduction of surface spoilage organisms and destruction of evolved gaseous ethylene that causes premature ripening.

BRIEF DESCRIPTION OF DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DISCLOSURE

Figure 1:
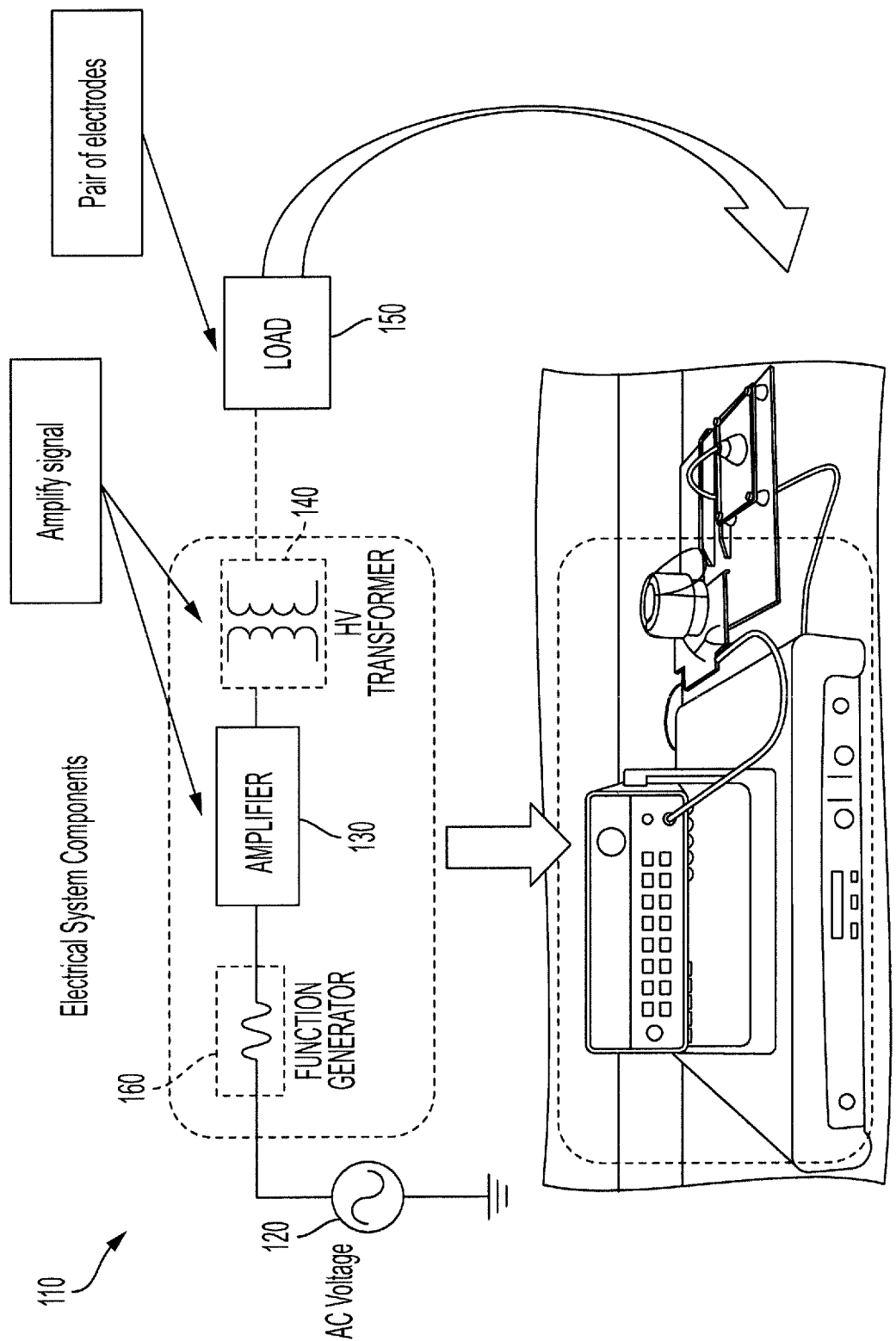
FIG. 1 is a schematic diagram of a plasma reactor system in accordance with an embodiment of the present disclosure.

Embodiments of the present disclosure relate to plasma reactor apparatuses, systems, and methods for providing power supply unit(s) for plasma generators. Power supply units of the present disclosure can be small and/or portable and can be used for a variety of applications. For example, power supply units of the present disclosure can be used to drive plasma generators having dielectric barrier discharge (DBD) devices, such as plasma actuators.

Power supply units of the present disclosure can provide power to at least one load. Each load can be, for example, an electrode, such as an electrode used for plasma generation. In an embodiment, a power supply unit can include a system which is capable of running more than one load. In an alternative embodiment, a power supply unit can include multiple systems put together and controlled by a controller. Each system can be, for example, a power amplifier such as a zero-voltage switching amplifier. The controller can be any controller known in the art capable of driving and/or switching voltage-providing systems, for example, a microcontroller or other circuit. In an embodiment, the controller can be a motherboard including a microcontroller and additional circuitry which can be provided to inhibit damage.

In an embodiment, a power supply unit can include a single power amplifier, which can be used to power on and off an array of loads, such as plasma generator(s). In an alternative embodiment, a power supply unit can include at least two power amplifiers controlled by a controller. The controller can be configured to turn on and off each power amplifier. The power supply unit can also include a switch connecting each load to a power amplifier. The controller can be configured to open and close the switches connecting the loads to the power amplifiers.

In one embodiment, the current and the voltage waveforms of the transistor provide a condition when the high current and the high voltage do not overlap simultaneously that minimizes the power dissipation and maximizes the power amplifier efficiency. Accordingly, an exemplary embodiment utilizes a power MOSFET transistor which has a built-in diode across its source and drain. This diode can inhibit reverse breakdown of the transistor and keep the power amplifier operational.

Embodiments of the subject invention can include an over-current protection circuit that protects the circuit components of the power supply unit from damage in situations where the interaction between the load and the power amplifier yields high current levels that can otherwise damage the CPR device. This over-current protection circuit can also prevent the flow of current in the CPR circuit when a load is removed, until the load is replaced and the system is reset. The main reason for the increment of the CPR's current is the expected deterioration of the DBD electrode arrangement (load) that occurs after a considerable amount of use. Generally, the CPR's circuit operates at a steady current level, determined mainly by the load and operating frequency. However, after a considerable amount of use of the device, the dielectric material between the plasma electrodes can present signs of corrosion, yielding a progressive increase in current that can surpass the tolerance limit of the circuit or even cause the breakdown of the dielectric. Therefore, the CPR can incorporate a circuit that identifies the increase, or the increment, in the current and stops the operation of the circuit. The operation of the circuit can be reinitiated after the load (DBD electrode arrangement) is replaced.

Figure 23:
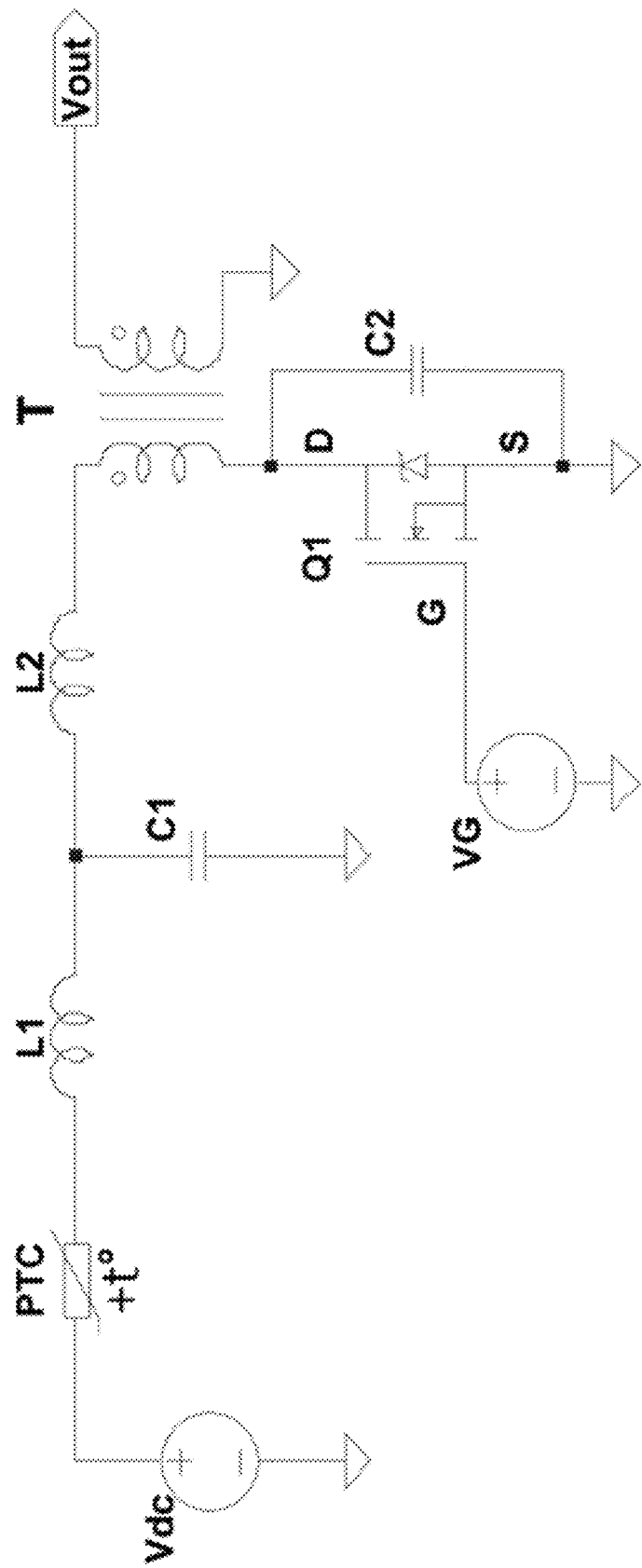
FIG. 23 shows a diagram of an embodiment of an over-current protection circuit in accordance with an embodiment of the invention.

Embodiments of the subject invention can incorporate a simple over-current protection circuit, such as the circuit shown in FIG. 23, where a Positive Temperature Coefficient (PTC) resettable fuse is connected between the DC input voltage and the rest of the CPR's circuit. The current rating of the PTC resettable fuse can be selected according to the desired operation of the CPR, e.g., the average value of current consumption of the CPR. The initial resistance of the resettable fuse is very low, easily allowing the flow of current in normal operating conditions. The increase, or increment, in current beyond appropriate levels increases the thermal temperature of the PTC and simultaneously increases the resistance of the PTC, where the increase in resistance reduces the current flow and eventually powers the device off. After the load (e.g., the DBD electrode arrangement) is replaced, and the device is powered up, the current returns to normal levels and the resistance level of PTC fuse returns to a low value allowing the flow of current and the generation of ozone. The use of the circuit shown in FIG. 23 for limiting the current level in the device is simple, but presents the following limitations: the CPR should preferably be disconnected manually from the DC supply before replacing the load (e.g., DBD electrode arrangement) to avoid electric shock; the response time of the PTC fuse may not be fast enough to prevent circuit components from being damaged, such as in situations where the current increases very quickly.

Figure 24:
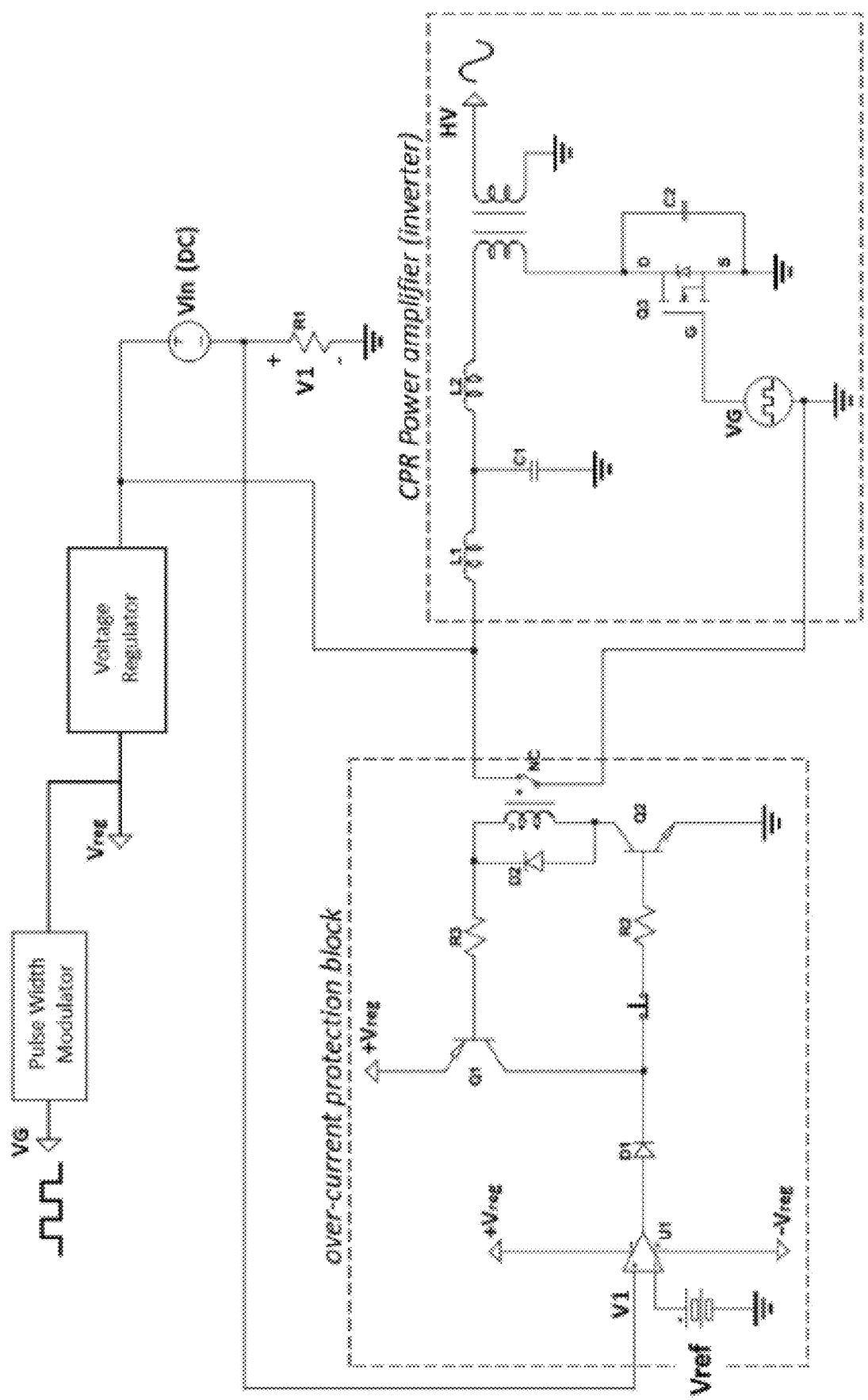
FIG. 24 shows a diagram of an embodiment of a power supply unit for driving electrodes of a plasma reactor in accordance with an embodiment of the invention.

In further embodiments, a more reliable alternative to the circuit in FIG. 23 can be used, such as a circuit that incorporates a more sophisticated module, which, in addition to stopping or limiting the flow of current, can also automatically disconnect the CPR from the DC power supply, allowing the replacement of the electrode arrangement (load) without electrical hazard. An example of such an alternative system is shown in FIG. 24. In this system the CPR circuit is divided in different stages. The change in DC current that is feeding the CPR's power amplifier circuit is detected, and, if the current increases to undesirable levels, the overcurrent protection module interrupts the current going to the power amplifier. The current flow is restored only after the system is reset by pressing a switch. Referring to the circuit of FIG. 24, a resistor is placed in series with the dc input branch that feeds the power amplifier of the CPR. The voltage difference in this resistor (V1) is connected to the non-inverting input of an operational amplifier, whereas a reference voltage (Vref) is fed to the negative input of the same op-amp. The reference voltage can be set via one of multiple different methods, such as a Zener diode, a voltage divider, a potentiometer, etc. The op-amp functions as a comparator that sense the difference between the series resistance voltage and the reference voltage (V1−Vref). If V1 is lower than Vref, the output of the op-amp is set to a negative voltage (−Vreg). If, however, current increases and V1 increases to the point that V1 is larger than Vref, the output of the op-amp becomes a positive voltage +Vreg. Vreg is supplied to the op-amp by a voltage regulator module. The value of this voltage can be set to, for example, 10V, 12V, 15V, etc. As long as V1 is lower than Vref, the output of the op-amp is negative, and the rest of the over-current protection circuit is not activated. In other words, the CPR works as usual. However, when the current increases too much and V1>Vref, the output of the op-amp switches to +Vreg and the next stage of the OC-protection circuit is enabled. Such stage includes one NPN and one PNP bipolar transistor working in the saturation region. A relay switch is connected to the collector of the NPN transistor. In the schematic shown in FIG. 24 the relay is placed in the emitter of Q2, but the relay can instead be placed in the emitter of Q2 or in parallel with the collector or emitter of Q2. The relay is configured as a normally closed switch (NC) that allows the flow of current in the CPR power. When the amplifier OC-protection circuit is activated, current flows through the relay coil and the switch opens, hence interrupting the current flow in the power amplifier. After the load is replaced, the current returns to the appropriate levels and V1<Vref. However, even though the output of the power amplifier returns to the −Vreg state, Q1 and Q2 remain in the saturation region and current still flows in the relay coil, keeping the power to the power amplifier interrupted. This safety mechanism is important, because it guarantees that the current cannot return to the power amplifier circuit when the load is being replaced. In order to restore power to the power amplifier a normally closed (NC) push button switch is placed in the sub-circuit of Q1 and Q2, for example, in the base of Q2. When the NC switch in the sub-circuit of Q1 and Q2 is pressed the flow of current in the relay coil is interrupted, and when the NC switch is released, current flow is then allowed in the power amplifier. A freewheeling diode is placed in parallel with the relay coil to suppress flyback current effects.

The power supply unit of a plasma reactor system can also include a feedback mechanism, such as feedback circuitry, and the controller can be configured to control the feedback circuitry, which can be switched from load to load. The feedback circuitry can be configured to monitor the plasma reactor system, which can include monitoring the load(s), to determine if/when the value of a parameter of interest is outside an acceptable range and then adjust another parameter accordingly or to control operation of the plasma reactor system. For example, the feedback circuitry can be configured to control operation of the plasma reactor system, including activating or deactivating the power supply unit. Further, the feedback circuitry can be configured to adjust the frequency of operation based on, e.g., changes in the impedance of the load (or loads) of the power supply unit and/or changes in the voltage provided by the power supply unit. In many embodiments, the feedback circuitry can be configured to monitor (e.g., by measuring) an operational parameter.

A variety of sensor types can be employed as well with the feedback circuitry. The following are examples of sensors that could be used for sensing, feedback and control of the active surface or the plasma generator device itself: moisture/humidity sensors to detect moisture over the active surface or of the device or of a vehicle/structure to which the sensor is attached, air speed sensor to determine a speed of airflow over the active surface or of the device or of a vehicle/structure to which the sensor is attached, infrared beam to provide a curtain over the active surface or device; radio frequency field to provide a curtain over the active surface or device; motion sensor to detect movement over the active surface or of the device; acoustic beam to detect movement over the active surface or of the device; temperature sensors to determine contact by another object or change in the device; pressure sensors to determine contact by another person or object or change in the device, such as a foreign object (e.g., dust); capacitive sensors to determine contact by another person or object or change in the device; and conductivity sensors to determine contact by another person or object or change in the device.

As an example, a moisture sensor can be used to determine when adverse conditions (e.g., wet conditions) may be present for operation of a power supply unit and/or power amplifier, such as conditions making likelihood of a short-circuit failure possible. In addition, an air speed sensor can be used to determine when a vehicle/structure is moving at a slow speed that makes operation of a plasma generator designed to reduce drag of the vehicle/structure not effective, and thus, an inefficient use of power resources.

Figure 18:
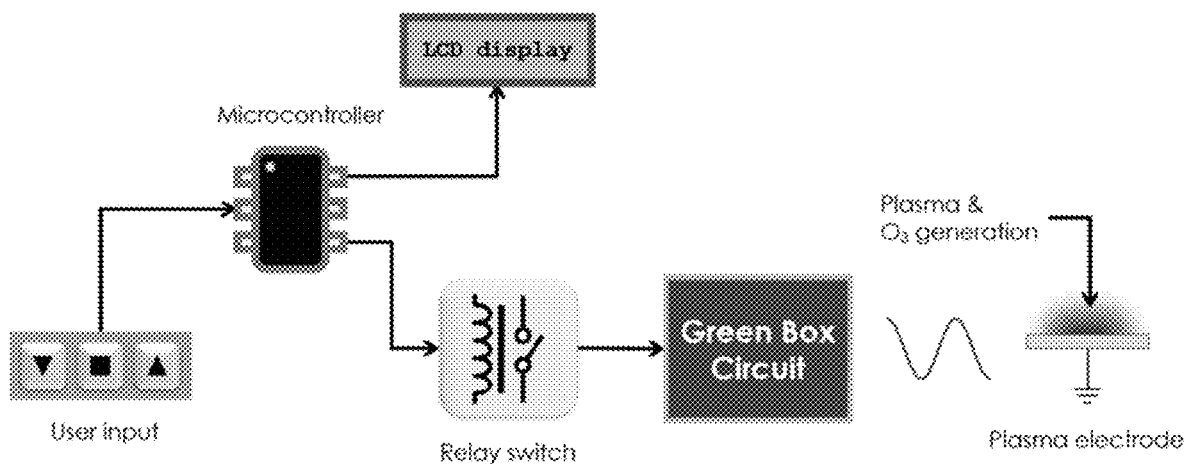
FIG. 18 shows a greenbox system diagram.
Figure 19:
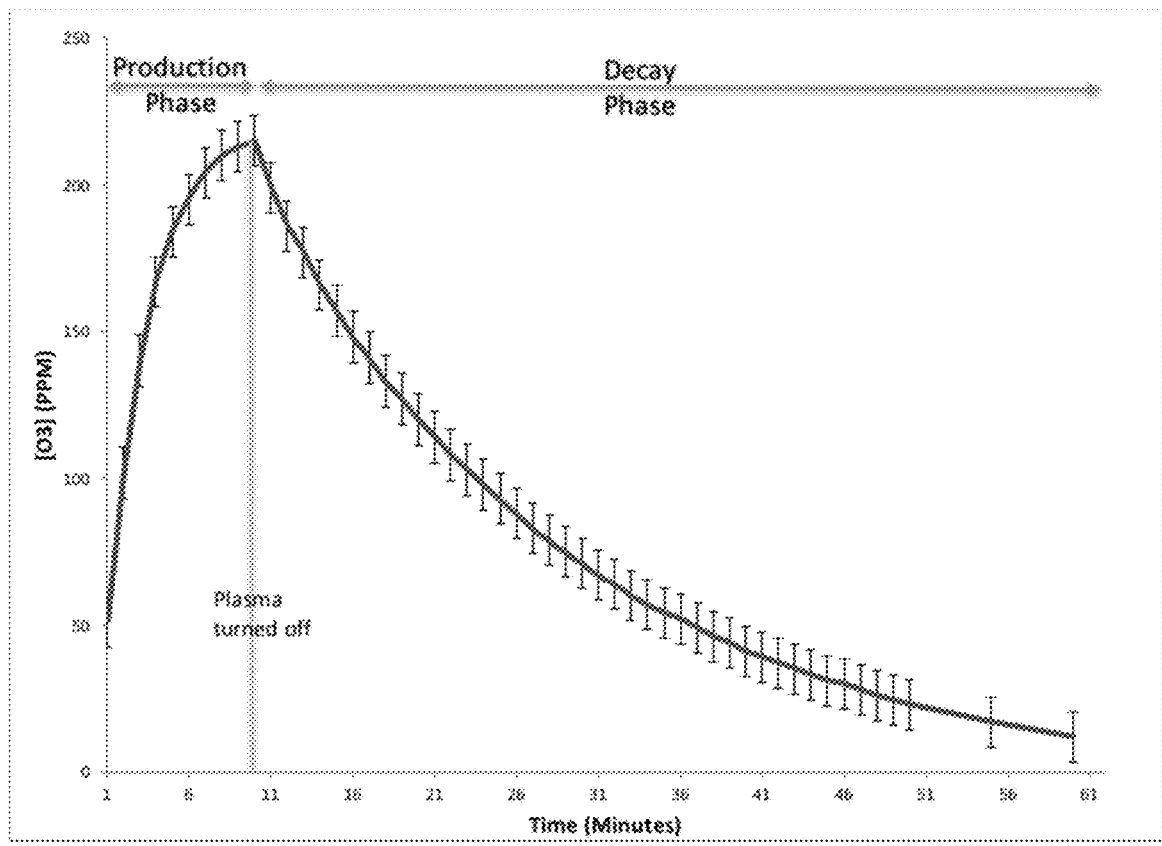
FIG. 19 shows ozone generation within a 3 cubic foot box.
Figure 20:
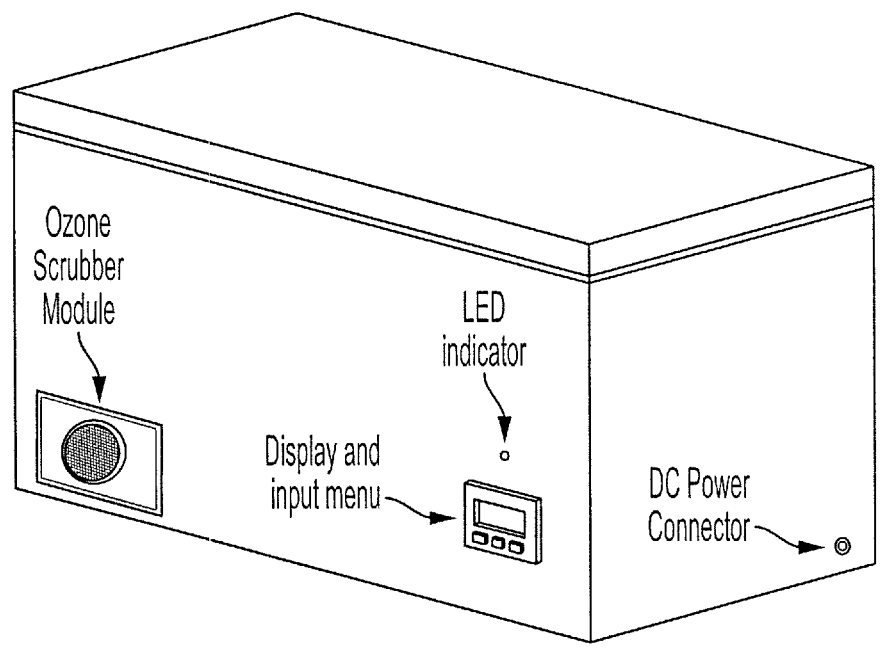
FIG. 20 shows an external view of the greenbox.
Figure 21:
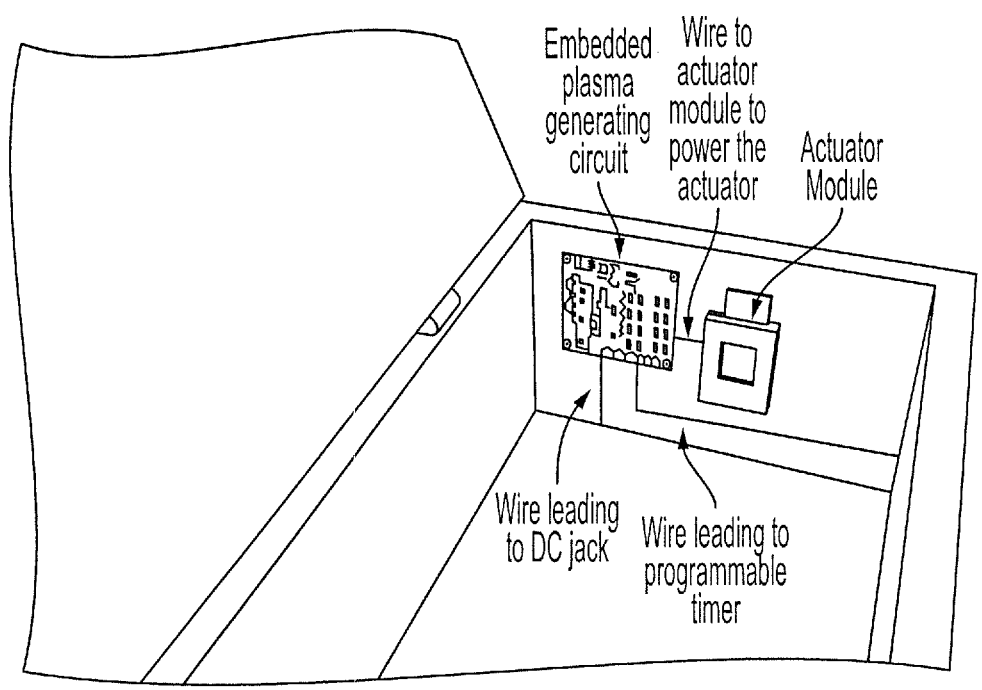
FIG. 21 shows an interior of the greenbox showing the actuator module and embedded circuitry.
Figure 22:
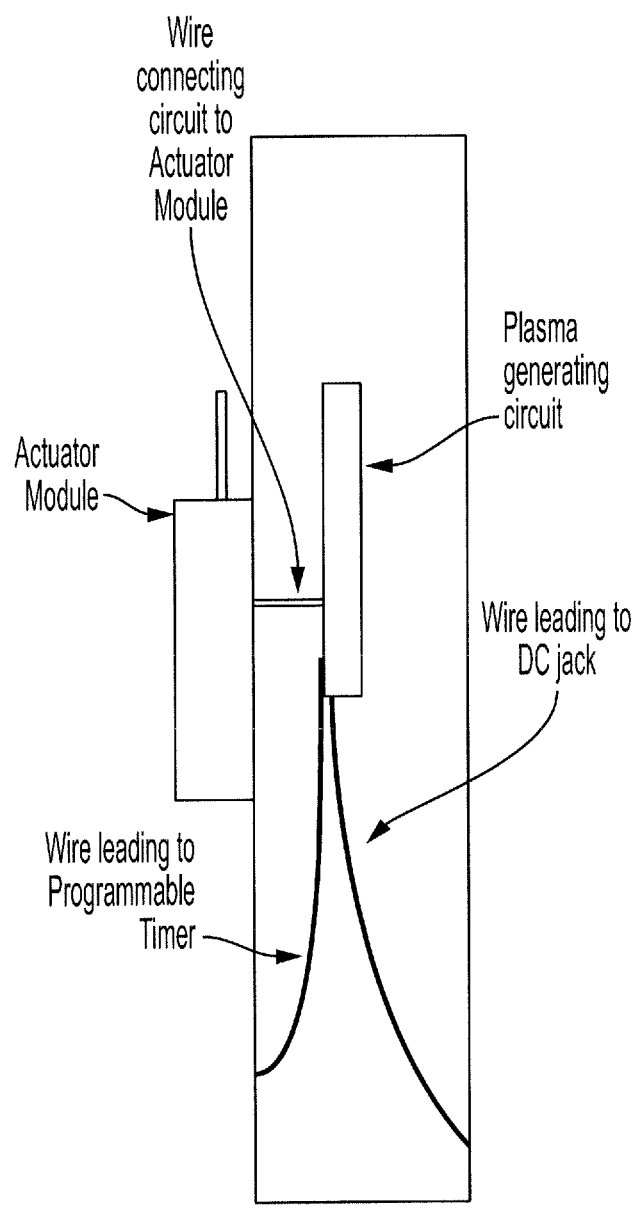
FIG. 22 shows a cross sectional view of the wall of the greenbox containing the embedded circuitry.

A timer module can be added to control the operation of the CPR. Instead of running continuously, the CPR can be programmed to operate at specific intervals and/or specific time of the day/night. In an embodiment, this timer module increases the lifespan of the CPR system, reduces energy consumption, and regulates ozone to safe levels. The basic principle of operation of a timer module in accordance with an embodiment of the invention is illustrated in FIG. 18. In this schematic, the timer function is performed through a dedicated microcontroller. In alternative embodiments, a simpler timer unit can be utilized. First, preset parameters of time are selected through a mechanical input interface, such as one or more buttons, a touch-screen display, etc. This input via the interface is converted to electrical signals that travel to the input ports of the microcontroller enabling the timer registries of the microcontroller. When the programmed time equals the time tracked by the microcontroller's inbuilt clock, an output of the microcontroller can be enabled, allowing the current flow in the coil of a normally open (NO) relay switch. The switch of the relay is placed at the input branch of the CPR's power amplifier. Since the switch is normally open, the CPR only works during the time period the microcontroller enables the output associated with the relay. In addition, an LED can be added to serve as an indication that the CPR is in operation.

An embodiment of the subject CPR includes the conversion of the AC power provided by the electrical grid (wall outlet) to suitable DC power levels required to activate the device. Accordingly, this embodiment does not need an external DC power supply, but, instead, can be connected directly to the electrical grid.

In many embodiments, a power supply unit can provide voltage to at least two loads. Each load can be, for example, an electrode, such as an electrode used for plasma generation. In many embodiments, a power supply unit can include an inductor and/or capacitor. For example, the power supply unit can include one or more power amplifiers, and each power amplifier can include one or more inductors and/or capacitors. In one embodiment, the load can include dielectric barrier discharge (DBD), where a first electrode, or set of electrodes, is exposed at the surface to the surrounding atmosphere (or covered with a coating) and a second electrode, or set of electrodes, is embedded inside a layer of insulator. A voltage can be applied between the first electrode, or set of electrodes, and the second electrode, or set of electrodes, to create a plasma at the surface. In order to disperse the plasma in a continuous fashion over the surface phase lagged electrode circuitry may be employed. In one embodiment, the phase lagged electrode circuitry applies voltages across corresponding electrodes from the first set of electrodes and the second set of electrodes, which form electrode pairs, such that different electrode pairs are excited with voltages having a phase lag compared with the voltage applied to the adjacent electrode pair. In an embodiment, the electrode spacing in each direction is such that the discharge is on both sides of the electrode. One set of electrodes may be powered with a pulsing AC or DC voltage and the other electrode set can be grounded. For AC voltage various waveforms can be utilized, such as sinusoidal, ramp, and sawtooth waveforms. The electrodes may also be operated at a beat frequency. In addition, application of fixed potential (DC) can be implemented. The electrode spacing may vary from, for example, a few microns to several millimeters.

In certain embodiments, the voltage potential applied to a power supply unit can be applied in a duty cycle. A duty cycle can advantageously minimize the power requirement. In each cycle of the duty cycle, the voltage potential can be applied to a system of the power supply unit for one or more portions of the cycle and not applied to that system for the other portions of the cycle. During such other portions of the cycle, the voltage potential can be applied to another system of the power supply unit or not applied to the power supply unit at all. In an embodiment, the voltage potential can be applied as a repeating cycle of one or more pulses. For example, a power supply unit can include three systems each providing power to a load, for a total of three loads. A voltage potential can be applied to each system of the power supply unit for one third (33.3%) of the cycle duration, in one embodiment.

Embodiments of the present disclosure provide power supply units that are portable and that can provide voltages in the kV range, which can, e.g., produce DBD plasma. In a specific embodiment, the power supply unit can provide voltages of at least 12 kVpp. In addition, power supply units of the present disclosure can power more than one load. For example, a power supply unit can generate plasma on more than one load. Each load can be, for example, an electrode. For example, the power supply unit can either include a single system capable of running more than one load or include multiple systems, each simple and small enough so multiple systems can be put together. In the case of multiple systems, the multiple systems can be controlled by a controller. The loads can produce plasma simultaneously and/or a duty cycle can be applied. The number of loads will vary depending on, for example, the desired application and/or the desired surface area to cover.

Referring to FIG. 1, in an embodiment, a power supply unit 110 can include a power input supply 120 and a power amplifier including an amplifier 130 and a transformer 140. The power supply unit 110 can be connected to multiple loads 150, such as two electrodes forming a plasma generator. The load can have, for example, a size of 1.5 inches by 1.5 inches, as a non-limiting illustration. The power input supply 120 can operate with a DC input signal and output an AC signal with frequencies of the order ~kHz, in some embodiments. Further, in some embodiments, the power input supply 120 can operate with an alternating input signal, such as, in conjunction with, a function generator 160.

In an embodiment, a power supply unit 110 can include at least one system having a circuit topology including a transistor 210 (FIG. 2), an inductor 220 (FIG. 2), a capacitor 230 (FIG. 2), and a transformer 140. The transistor can be used as a switch. Such a system is an amplifier, and this amplifier is a zero-voltage switching (ZVS) amplifier, which yields 100% efficiency theoretically.

Figure 2:
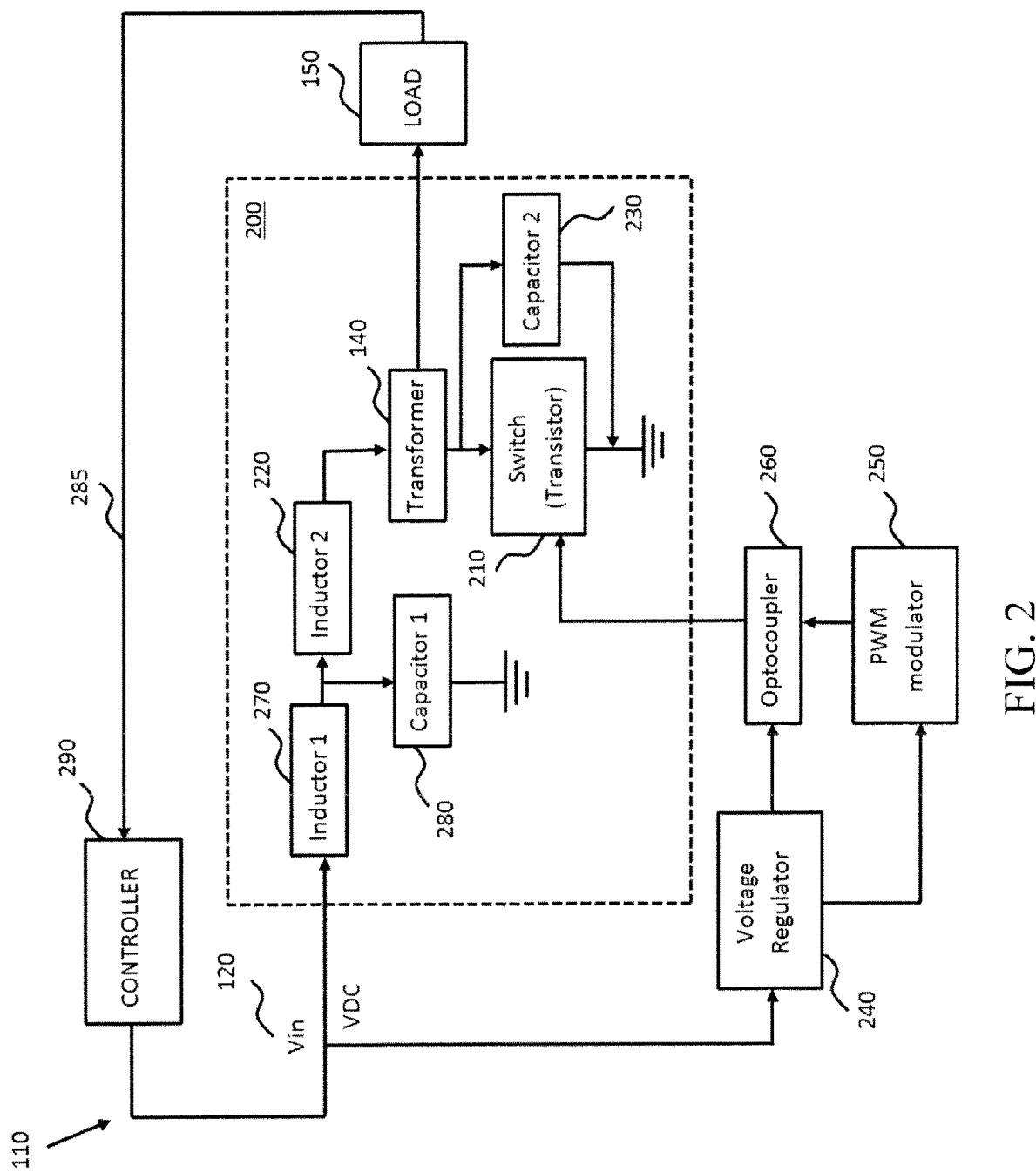
FIG. 2 is a schematic diagram of components of a power supply unit of the plasma reactor system of FIG. 1 in accordance with an embodiment of the present disclosure.
Figure 3:
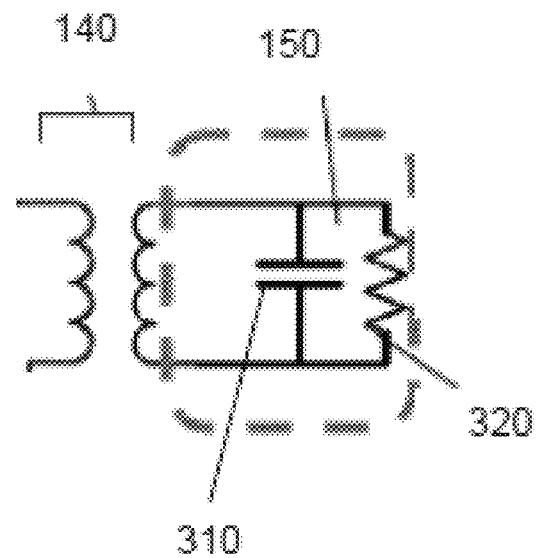
FIG. 3 is a circuit diagram representation of a load of a plasma reactor system in accordance with an embodiment of the present disclosure.

Referring to FIG. 2, the transistor or switch 210, inductor 220, capacitor 230, and transformer 140 can be arranged as depicted, in one embodiment. The load 150, such as an electrode, can be represented by a capacitor 310 and a resistor 320 in parallel, though embodiments of the present disclosure are not limited thereto, as represented in FIG. 3. The load 150 can be connected to the secondary side of the transformer 140 (i.e., the other side from which the power input supply 120 system is connected). The impedance across a wide range of frequencies looking into the primary side of the transformer 140 can be measured.

The self-resonance frequency of the transformer 140 and the load 150 can then be selected for various embodiments and/or applications. This can yield maximum voltage amplitude on the load 150 because maximum real impedance is seen on the primary side of the transformer 140. The capacitor 230 (across the drain and the source of the transistor 210) can be a component with respect to allowing proper zero-voltage switching (ZVS) operation to be obtained and yielding a high efficiency. In certain embodiments, the frequency of the transformer 140 and the load 150 can be selected or tuned to work at a different frequency parameter or range, which allows for adaptation of the power supply unit 110 for many different applications. Accordingly, capacitive values of the power amplifier 200 may be tuned to adjust for modified frequency values to match the impedance of the load 150. Thus, the capacitor 230 comprises of a variable capacitor, such as a capacitor matrix component, or a diode with voltage-controlled capacitance, known as varactor, in some embodiments. Further, in some embodiments, the power input supply 120 comprises a variable frequency generator.

Referring back to FIG. 2, the switch 210, in one embodiment, requires lower voltage than other components, such as the transformer 140. Accordingly, voltage regulator 240, pulse width modulator 250, and optocoupler 260 circuitry components are provided to produce a low voltage square wave to drive the switch 210, in one embodiment.

In certain embodiments, a low-pass filter is included, because the current across the inductor 220 and the transformer 140 can oscillate, which can lead to a negative current fed back to the power input supply 120. Thus, the low-pass filter block this returning current and only allows DC current and DC voltage being drawn from the power input supply 120. Accordingly, in one embodiment, the power supply filter includes an inductor 270 and a capacitor 280, as shown in FIG. 2.

Embodiments of the power supply units 110 in accordance with the present disclosure can achieve advantageous results compared to existing amplifiers. Typically, a full bridge rectifier is only practical for a single load system. According to embodiments of the present disclosure, a power supply unit 110 can include multiple amplifiers (systems) and multiple loads and can have a simple topology with a small number of components and small size. Also, the shunt capacitance included in designs of the present disclosure increases efficiency by helping to obtain ZVS operation. Power supply units of the present disclosure can advantageously obtain kV-level output voltages with high efficiency. In accordance with the present disclosure, power supply units advantageously achieve high efficiency with small size and simple topology, thereby allowing multiple power amplifiers (systems) and multiple loads.

Figure 4:
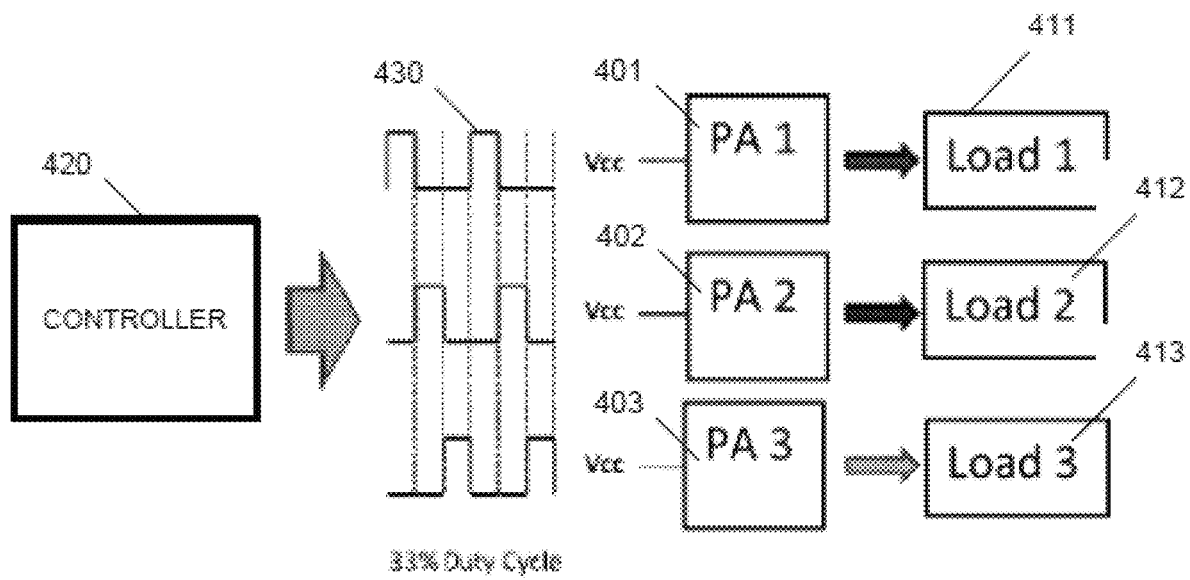
FIG. 4 is a schematic diagram of a power supply unit having multiple loads controlled by a controller in accordance with an embodiment of the present disclosure.

In addition, embodiments of the present disclosure are advantageously capable of running multiple loads. Small and simple systems can be used that can be scaled up easily. Referring to FIG. 4, a power supply unit can include multiple power amplifiers systems 401, 402, 403 each aiding in powering a load 411, 412, 413, in one embodiment. The systems, or power amplifiers (PAs), can be controlled by a controller 420. Though FIG. 4 shows three power amplifier systems 401, 402, 403 and three loads 411, 412, 413, embodiments of the present disclosure are not limited thereto.

As discussed, duty cycling can be used for applying power to the PAs 401, 402, 403. In an embodiment, the signal 430 applied to the PAs 401, 402, 403 can be applied to each PA for a portion of the cycle. For example, a power supply unit can include 3 PAs each powering a load, and each PA can have a signal applied to it for one third of the cycle, as shown by way of example only in FIG. 4. In certain embodiments, the controller 420 can control the application of the signal to the PAs.

Referring back to FIG. 2, a main feature of an exemplary embodiment of the power supply unit 110 is the switching power amplifier that is configured to set up and convert that step up and convert low DC input voltage into a very high AC voltage (kilovolts range), in which the power amplifier 200 utilizes the transistor 210 as a switch. To control the switching frequency and hence the output voltage frequency, a pulse width modulator (PWM) 3 with a 50% duty cycle is utilized in one embodiment. To guarantee appropriate functioning of the PWM circuit 3, a voltage regulator 2 is utilized along with an optocoupler 4 to protect circuitry components from voltage spikes coming from the output during plasma generation by the load 150. A circuit of the power supply unit 110 can include a feedback portion or mechanism 285 that feeds a controller 290, in one embodiment, as previously discussed.

In accordance with an embodiment of the present disclosure, a working frequency of the power supply unit 110 is set to match the resonance frequency of the transformer 140 attached to the load 150. By eliminating the reactance, the power transfer to the load 150 is increased and this, at the same time, has the advantage that the transformer 140 and load 150 can be considered as a resistor and the entire circuit can be reinterpreted as an RLC circuit.

In determining values of circuit parameters at resonance, two differential equations are yielded (as shown in the Appendix), as understood by one of ordinary skill in the art. One for when the switch 210 is on and one for when the switch 210 is off. In the ideal scenario, the switch 210 would have an instant transition from short to open (or vice versa) with no loss in power. However, in reality, there is still current passing through the switch 210 in the transition from short to open, and there is still voltage in the switch (transistor) 210 from open to short.

Therefore, to minimize the power loss during these instances, the drain voltage of the switch 210 and its derivative needs to be as close as zero as possible, which is referred to as zero voltage switching condition (ZVS). By numerically solving the two differential equations (see Appendix) and calculating the appropriate value for inductors 220, 270 and for the capacitor 230, the ZVS condition can be satisfied. Moreover, by the capacitor 230 comprising a capacitor matrix component, or other type of variable capacitor, that can be engaged to a desired capacitance value, the capacitance parameter can be adjusted to account for a changing operating frequency and to provide a matching impedance with the load 150.

It is noted that, while operating at the resonance frequency, the values of the inductors 220, 270, and the capacitor 230 can be set to have maximum power transfer by achieving zero voltage switch conditions when the switch 210 switches on and off. In particular, the capacitor and inductor values can be determined specifically for the resonance frequency. However, if the load 150 changes, then the resonance frequency also changes. Therefore, using a capacitor matrix as capacitor 230, the capacitance value of the RLC circuit can be tuned or adapted to any changing conditions of frequency or impedance. In particular, impedance matching on a primary side of the transformer 140 may be performed using a variable capacitor 230 (e.g., capacitor matrix component) to account for an impedance change at the load 150, in one embodiment.

Figure 5:
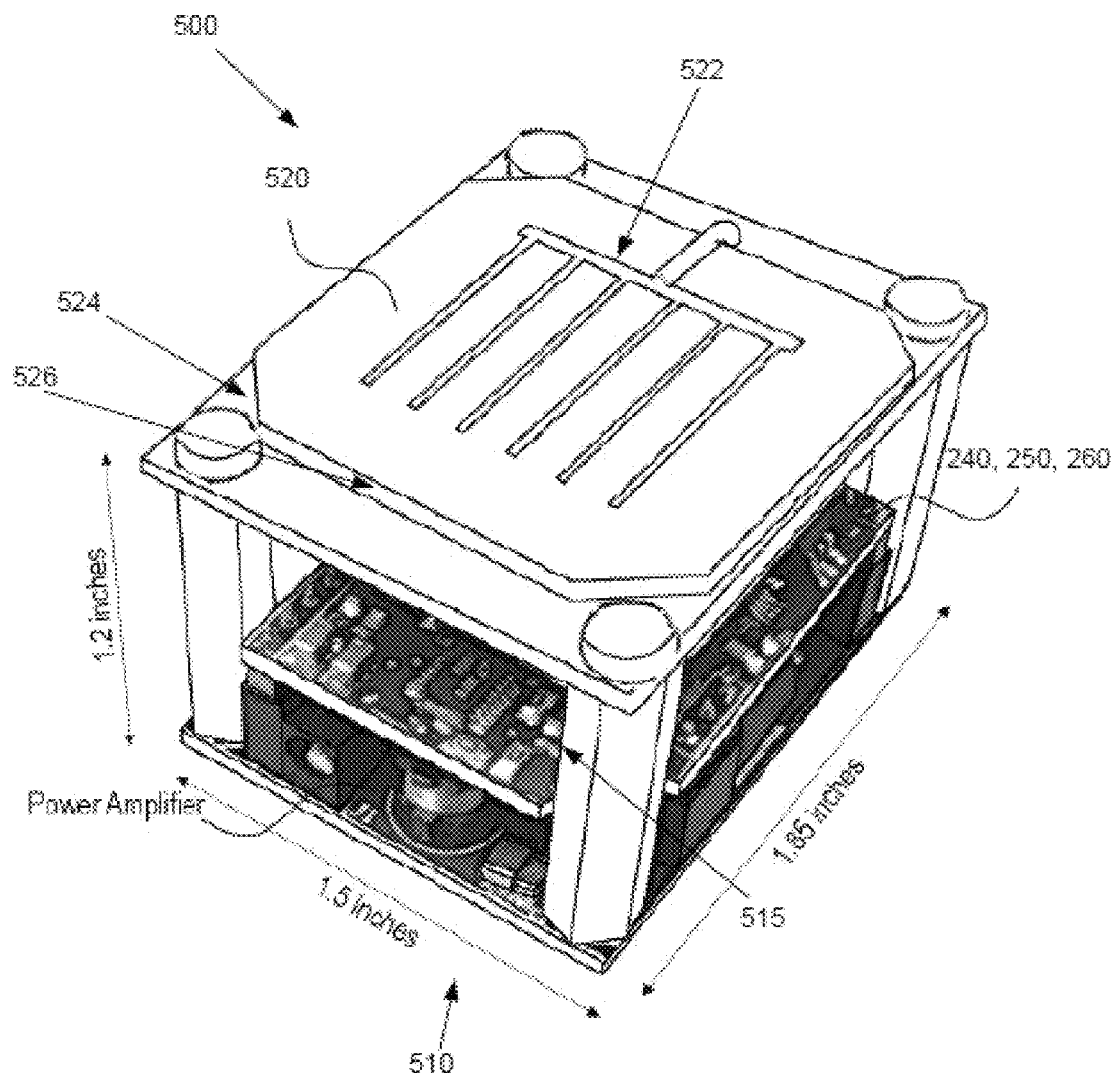
FIGS. 5-7 are diagrams of an embodiment of a structural arrangement of various components of a plasma reactor device or system in accordance with the present disclosure.

Next, FIG. 5 shows an embodiment of a structural arrangement of various components of a plasma reactor device 500 comprising the power amplifier circuit 510, switching power unit 515 (e.g., voltage regulator 240, pulse width modulator 250, and optocoupler 260), and a plasma generator load 520 in accordance with the present disclosure. In an exemplary embodiment, printed circuit boards (PCB) may be made of a common dielectric substrate material such as FR4 material with copper conductive layers, while the plasma generator load 520 may have any general shape, such as square shape, and is composed by two metal electrodes separated by dielectric material.

In the figure, the upper electrode 522 is a positive electrode and has a comb shape. The bottom electrode 524 is negative and has a square shape. The geometrical shape of both electrodes can change for different embodiments and for different applications. Electrodes 522 and 524 are separated by a dielectric material 526 that can have different thicknesses and can be made of different materials such as glass, ceramic substrates, PTFE (Teflon), liquid crystalline polymer and composites such as Teflon-ceramic, hydrocarbon-ceramic, etc., for various embodiments. The substrate can also be made of flexible material. Under the negative electrode 524, another layer of dielectric material may be added in various embodiments.

Figure 12:
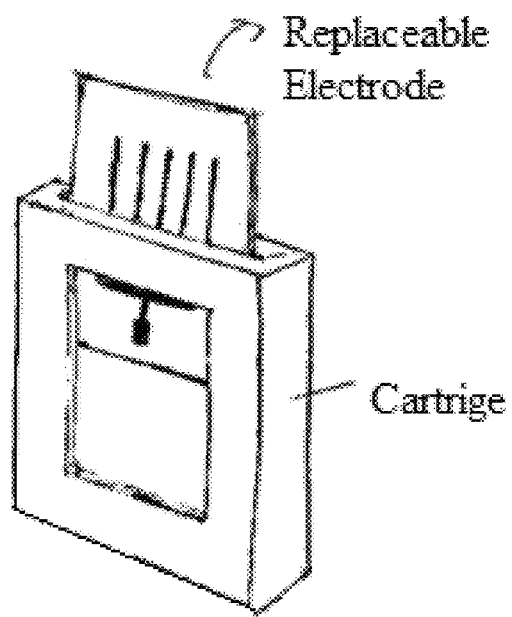
FIG. 12 shows the example of the CPR's electrode configured as a replaceable cartridge.
Figure 13:
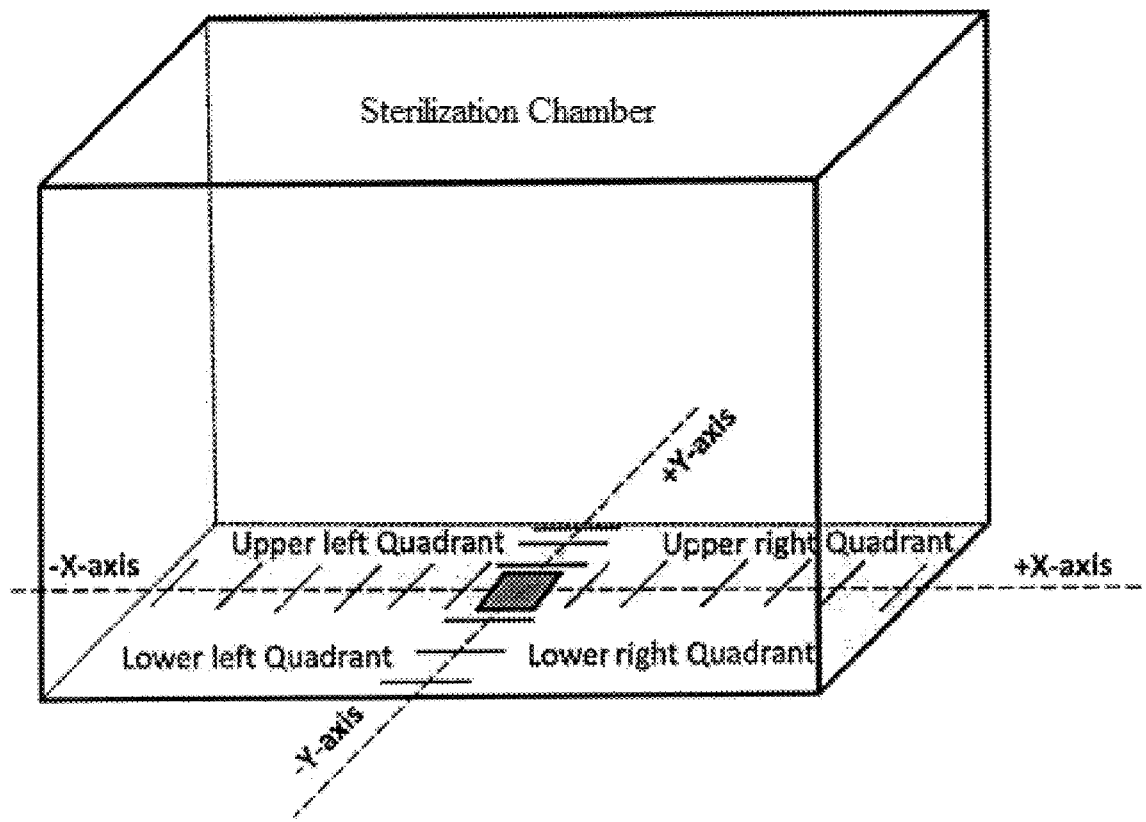
FIG. 13 shows a Sterilization chamber Test Volume Enclosure used to demonstrate rapid equilibration of ozone levels by virtue of APM flow actuator function that induces a three-dimensional body force to mix ozone with surrounding air for rapid mixing and equalization of ozone levels within the container.
Figure 14:
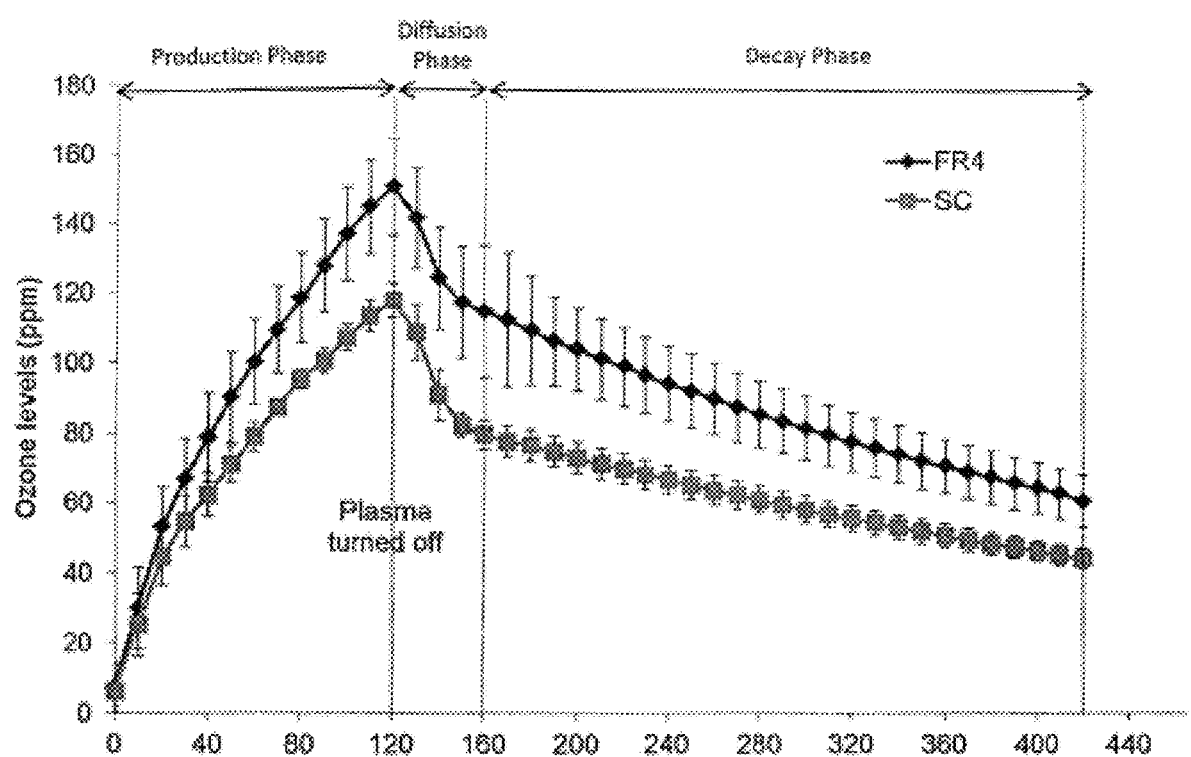
FIG. 14 shows the time course and concentration of ozone generation within a volume enclosure during and after a 2-minute activation of the APM device.

An embodiment of the CPR device may include a replaceable cartridge system that allows the easy replacement of the DBD electrode arrangement, such as when the dielectric material experiences excessive wear and corrosion. An example of such system is shown in FIG. 12. This system is designed to work in conjunction with the over-current protection circuitry (such as shown in FIGS. 23 and 24) to avoid danger of electric shock. The cartridge receptacle (labeled cartridge in FIG. 12) is made of a non-conductive material, and has two flexible metal contacts that coincide with the position of the ground and high-voltage pads of the DBD electrodes (load). When the replaceable electrode cartridge (labeled replaceable electrode in FIG. 12) is inserted current flows to the electrodes through the metal contacts of the cartridge receptacle.

The plasma generator load 520 is not limited to the particular pattern or style shown in FIG. 5. For example, many types of plasma actuators can be used for various types of applications. Possible applications include flow control (e.g., to reduce drag), deodorization, surface decontamination, sterilization, ozone gas production, etc. Accordingly, electrodes can be designed for a specific application and the power supply unit 110 and related components are configured to be tuned or adjusted to provide for optimum operating performance for the desired application. Thus, with reference to FIG. 5, the top reactor or load plate of the plasma generator load 520 can be switched with another plate design while still using the same power supply components, in accordance with the present disclosure.

Figure 11:
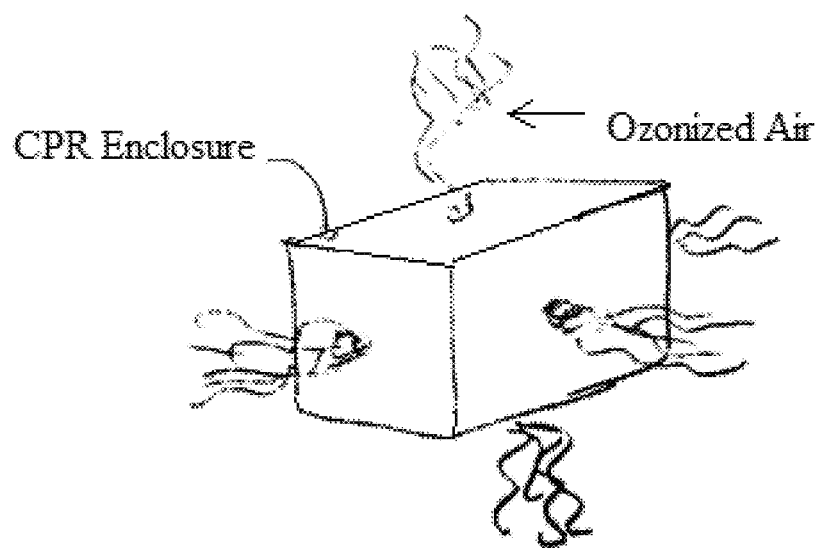
FIG. 11 shows the example of an enclosure with holes/openings containing the CPR. The ozone produced by the CPR is ejected through the holes.

The DBD electrode arrangement can induce air flow depending on the geometry/shape of the electrode among other factors. This air flow can be used in several ways to modify and/or enhanced ozone distribution. For example, the CPR can be placed in a small enclosure where the ozonized air is ejected through different holes/openings to improve the ozone distribution. The ozone can be ejected by the action of the hydrodynamic force induced by the plasma electrode or by a miniature fan system that could also serve as a coolant. An example is shown in FIG. 11, where the enclosure has one or more openings connecting an interior of the enclosure to an exterior of the enclosure.

Figure 6:
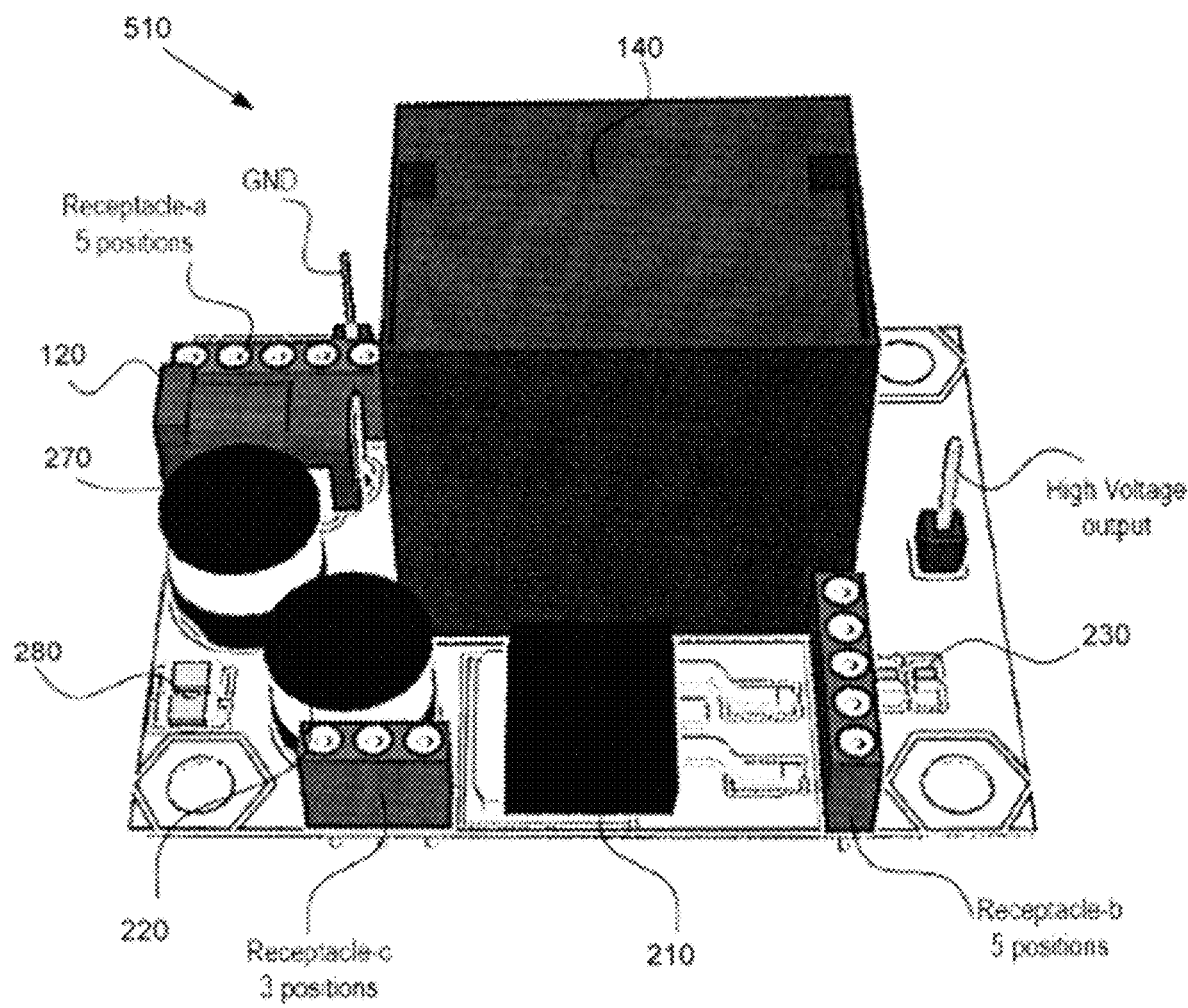
Figure 7:
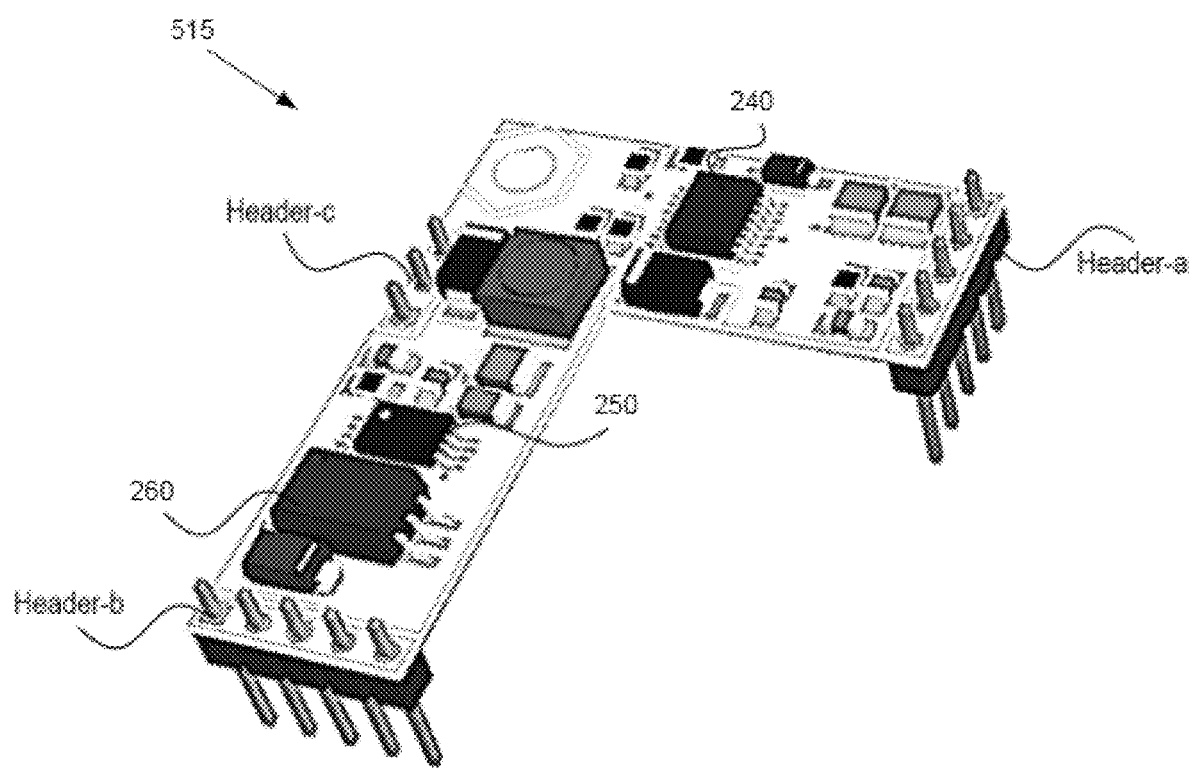
Figure 8:
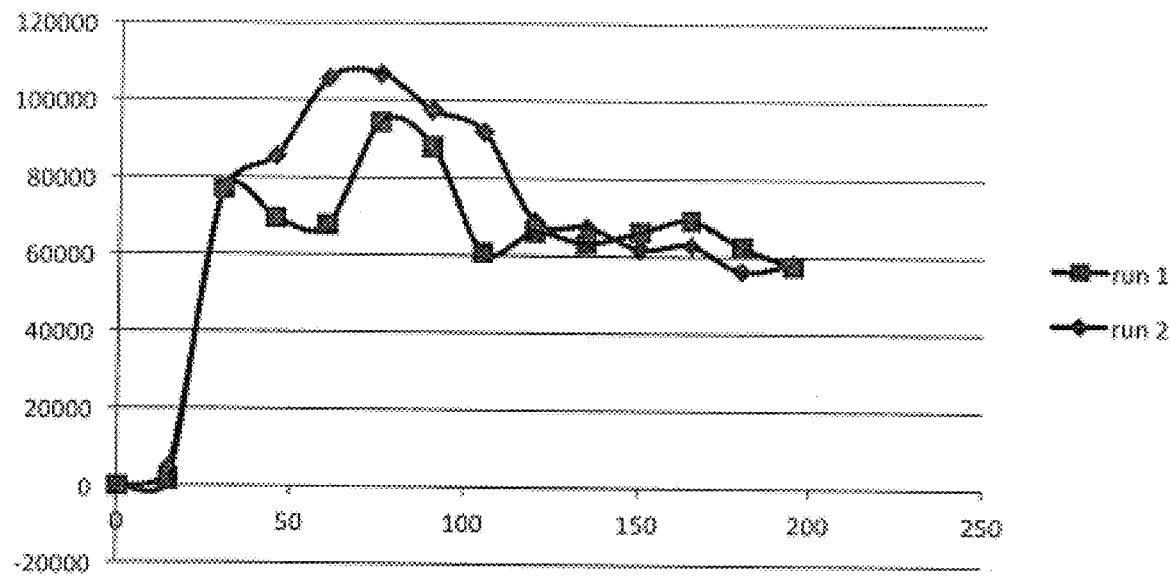
FIG. 8 shows ozone generation data in a 2'×2'×4' chamber, where the horizontal axis is time in seconds and the vertical axis is ozone concentration in ppb, for an input voltage of 20 volts.
Figure 9:
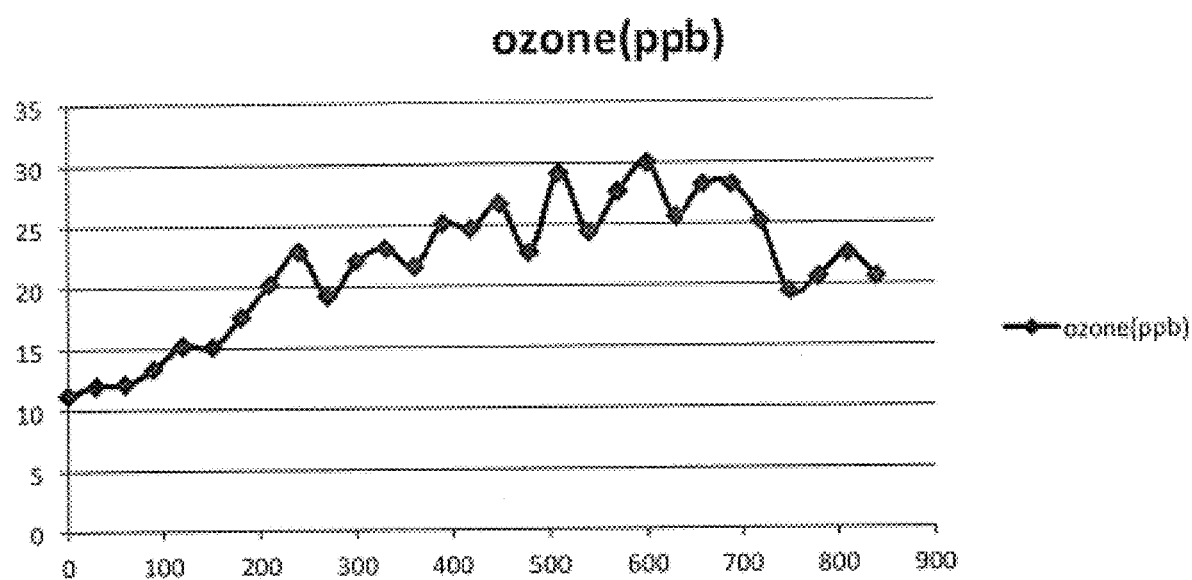
FIG. 9 shows ozone generation data in a 20'×15'×10' room, where the horizontal axis is time in seconds and the vertical axis is ozone concentration in ppb for an input voltage of 20 volts. The measurement was done at 20 inches (508 mm) from the plasma reactor.

Referring now to FIGS. 5, 6, and 7, components of the power reactor unit 500 are shown integrated in, but not limited to, a vertically-stacked arrangement. In particular, voltage regulator 240, pulse width modulator 250, and optocoupler 260 are shown built on a thin L-shape circuit board 515 held in a substantially level position elevated above the power amplifier circuit 510 (built on a thin printed circuit board). In this non-limiting example, the L-shape board has three headers strategically located, namely header-a, header-b, and header-c, as shown in FIG. 7. Each of these headers is attached to the receptacles on power amplifier circuit 510 of FIG. 6, namely receptacle-a, receptacle-b and receptacle-c, in the vertically-stacked arrangement.

Stated dimensions for the plasma reactor device in FIG. 5 indicate that the unit is 1.2 inches×1.5 inches×1.85 inches in this exemplary arrangement. However, other sizes—both smaller and larger—are possible in different embodiments. Further, in some embodiments, the respective components may be contained or integrated in a single flat planar layer and/or may be distributed in separate layers (e.g., circuit boards) having different geometries.

Figure 10:
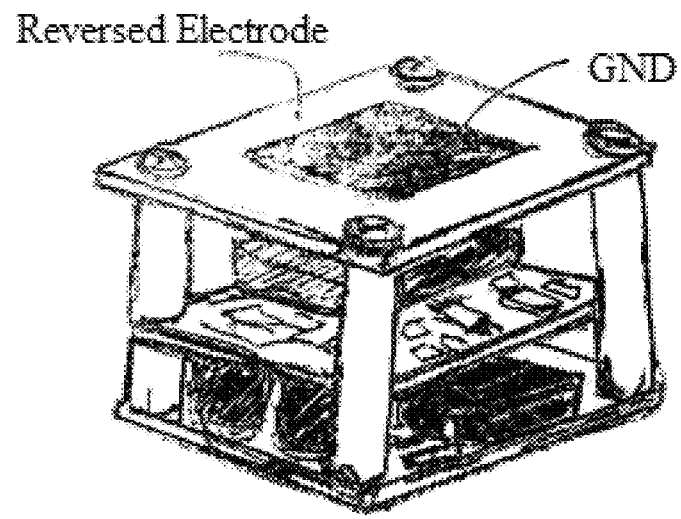
FIG. 10 shows an embodiment of the CPR, where the electrode arrangement has been positioned in a reverse fashion; i.e., the ground electrode is exposed and the high voltage electrode is looking towards the circuit.

In the stack arrangement of the CRP the electrode can be placed in a reverse fashion (looking towards the circuit), as shown in FIG. 10. This arrangement can serve different purposes. For example, if it is desired to avoid the ozone rapidly spreading in a single direction due the hydrodynamic force induced by the plasma, and, instead, it is desired for the ozone to slowly distribute in a more isometric fashion, the arrangement shown in FIG. 10 can be used. Also, the stacked configuration can be useful to avoid exposure of the high-voltage electrode for safety concerns.

Heat dissipation from components such as one or more transformers, one or more inductors, and/or one or more transistors can tend to increase the average temperature of the circuit, where it is desirable for the temperature to remain below the rating of the electronic components, to avoid limiting the lifespan of the device. Moreover, hot temperatures should be avoided when adapting the circuit to certain applications. Therefore, the CPR circuitry can be designed to include cooling systems/materials in trouble areas. In addition, a miniature fan system can act as a coolant and serve to eject the ozone in the manner described with respect to FIG. 12.

In accordance with the present disclosure, an exemplary embodiment a plasma reactor device is capable of generating dielectric barrier discharge plasma and consequently ozone with very low power and very compact size (less than 50 cubic centimeters). For example, the plasma reactor device is portable and able to operate with batteries. The device includes a power amplifier that converts a low DC input voltage into a very high AC output voltage and that also requires, pulse with modulator an optocoupler, and a voltage regulator. In one embodiment, a plasma reactor load with electrodes separated by a ceramic substrate is connected to an output. Such a scalable plasma reactor device is useful for a range of portable applications, including air flow control, sanitizing vacuum cleaner, deodorizer, etc., that can benefit from its low power consumption and small size. For further details and information on power supply units and plasma generators/actuators, see U.S. 2014/0346875 publication, titled "Method and Apparatus for Providing Power."

Data for Ozone Generation

| time (s) | run 1 | run 2 | run 3 | run 4 | run 5 in ppb |
|---|---|---|---|---|---|
| 0 | 17.9 | 19.8 | 19.3 | 19.5 | 19.4 |
| 15 | 1485.3 | 4717.8 | 22.3 | 21.5 | 22.8 |
| 30 | 76845 | 76372.9 | 22 | 20 | 23.5 |
| 45 | 69413.3 | 85604.8 | 20 | 20.6 | 5630.4 |
| 60 | 67730.3 | 105758 | 21 | 18.8 | 5910.3 |
| 75 | 94338 | 106811.8 | 42.1 | 35.8 | 6266.6 |
| 90 | 88012.7 | 97457.8 | 390.6 | 327.5 | 7427.7 |
| 105 | 60790.3 | 91901.4 | 777.4 | 688.1 | 7817.2 |
| 120 | 66078.2 | 68844.4 | 960.9 | 1800.2 | 8828.4 |
| 135 | 63205.6 | 67412.7 | 2489.1 | 3333.5 | 9009.7 |
| 150 | 66232.7 | 61763.5 | 2876.1 | 3965.5 | 9826.3 |
| 165 | 69252 | 62782.7 | 3467.1 | 5084.9 | 10280.4 |
| 180 | 62378.1 | 56176.1 | 4137 | 6517 | 10546.8 |
| 195 | 57593 | 58044.3 | 5390.5 | 7267.4 | 10596 |

| runs | x distance between plasma reactor center point and ozone probe | y distance between reactor center point & ozone probe | Total distance |
|---|---|---|---|
| 1 | 0 mm | 5 mm | |
| 2 | 0 mm | 5 mm | |
| 3 | 2 feet | 0 feet | |
| 4 | 2 feet | 0 feet | |
| 5 | 2 feet | 4 feet | |

Example DATA Sheet for Compact Portable Plasma Reactor

Physical Characteristics

| Property | Typical value | Unit |
|---|---|---|
| Dimensions | 1.5 × 1.85 × 1.2 | inches |
| Net weight | <50 | g |
| Storage temperature | −40 to 80 | ° C. |
| Operating temperature | −40 to 80 | ° C. |
| Cycles of operation before the DBD electrode requires replacement | >1000* | |
| Cycles of operation with 2 (9 Volt) commercial batteries | >30* | |
| Ozone ($O_3$) emission levels | 120 to 349 | ppm |

Electrical Properties

| Property | Typical value | Units |
|---|---|---|
| Input voltage | 25 | V (DC) |
| Input current | 400 | mA (DC) |
| Max. input voltage | 60 | V |
| Max. input current | 1.5 | A |
| Output voltage | 6 | kVpp |
| Operating frequency † | 42 | kHz |

DBD Plasma Electrode Characteristics

| | |
|---|---|
| Overall dimensions | 1.85 × 1.5 inches |
| Dielectric material | hydrocarbon/ceramics composite |
| Dielectric constant | 3.66 @ 8 to 40 GHz |
| Dissipation Factor | 0.0031 |
| Dielectric thickness | 0.030 inches (0.762 mm) |
| Electrode thickness | 1 oz. (35 µm) copper cladding |

Figure 15A:
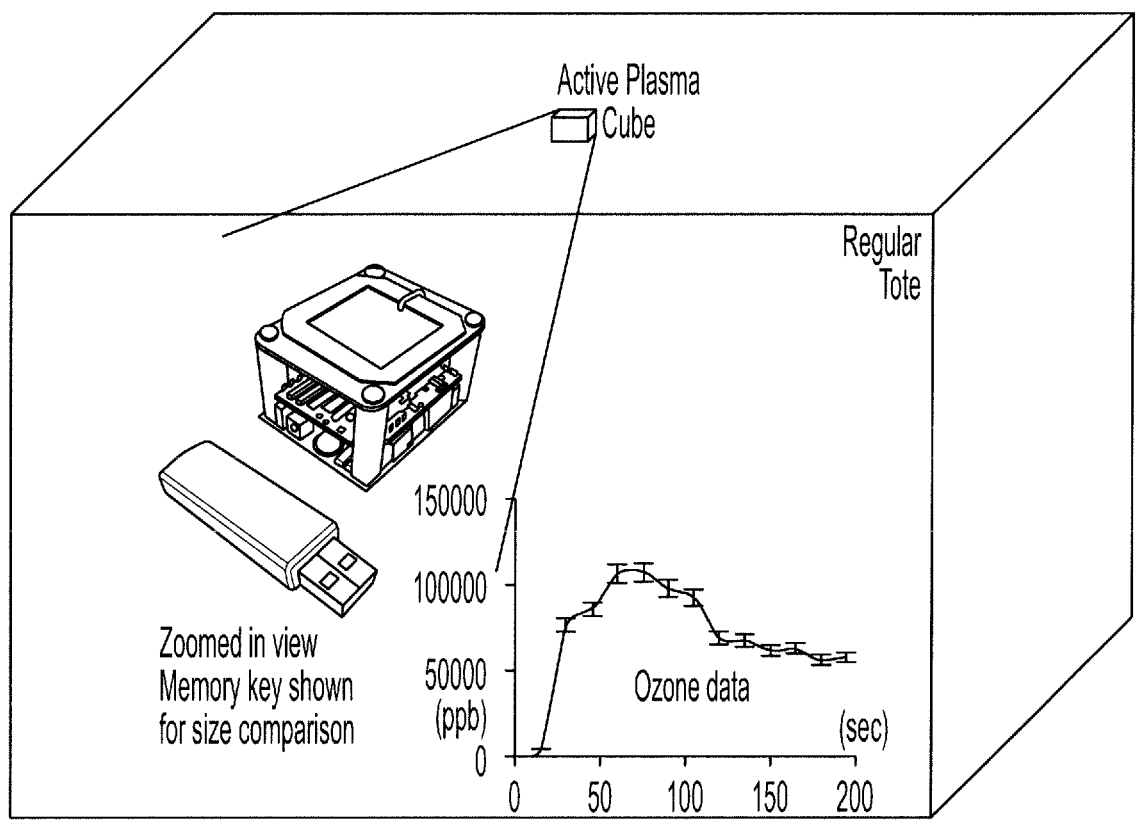
FIG. 15A shows the small, self-powered Active Packaging Module cube (inset) and corresponding ozone data (as in FIG. 2.) within a commercial "Tote" shipping container (FIG. 15B).

\* 1 cycle equals to 3 minutes of continuous operation.
† Operating frequency may vary slightly according to the plasma electrode design An embodiment of the CPR is shown in FIG. 15A. This model runs on a single 9V battery. Testing for produce shelf life was done with CPRs added to standard containers with no additional change to the container or its contents.

Figure 15B:
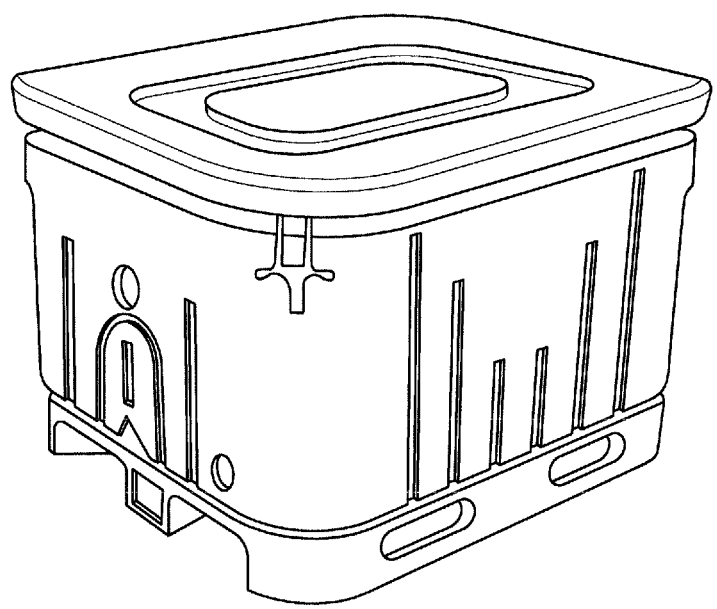
FIG. 15B shows a commercial "Tote" shipping container which can be incorporated into an embodiment of the subject invention.
Figure 16:
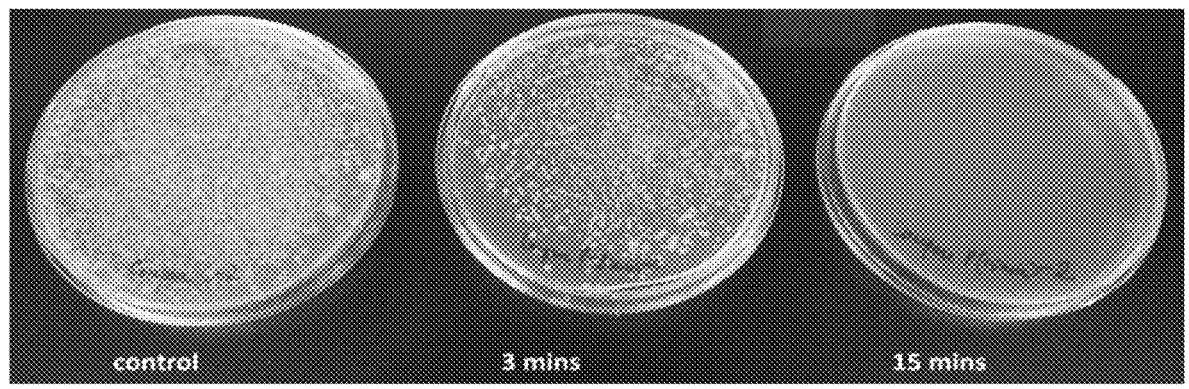
FIG. 16: Exposure of Green bean and tomato rot inoculum to ozone generated using 110V current. A $10^{-2}$ dilution plate for the control inoculum without plasma exposure and small duration (say x) and long duration (5×) exposer is shown on day 2.
Figure 17:
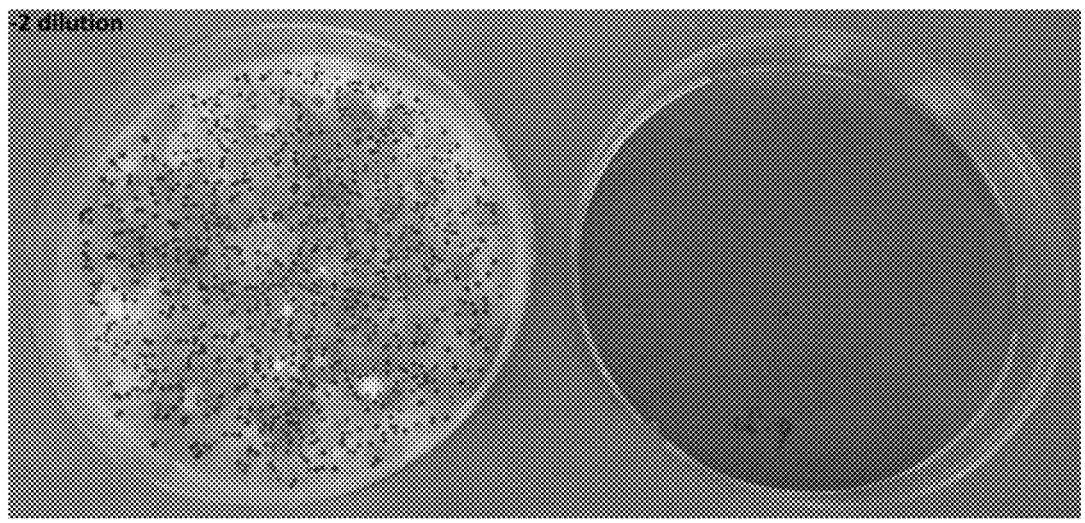
FIG. 17: Green bean and tomato spoilage organisms, control and with daily ozone treatment. Picture of 100 ul of 1:100 dilution of green bean and tomato inoculum spread on LB agar and incubated at room temperature for nine days. Plate on the left is the control. The plate on the right was exposed to ozone from a daily 3-minute plasma activation.

Coolers that were modified to permit monitoring of ozone levels were also used to test produce longevity at room temperatures. Room temperature storage containers can be designated as Green Box technology. Control and experimental (with CPR) containers were subject to the same environment conditions and tested following protocols established by the CPR and USDA. Another embodiment ran on two 9V batteries, and were activated and taped to the lid in storage totes (FIG. 15B). Similar sized coolers were used as test chambers, modified to allow ozone sampling. A single CPR was sufficient to produce enough ozone in a 2 cubic ft box to at least double the storage life of a variety of fresh produce types. Placing the CPRs in varying locations in the box did not affect the results.

An embodiment of the CPR device can operate in a household or commercial refrigerator, where the CPR runs on 110V AC current (a battery powered CPR can also be used in such refrigerators). CPRs to be used in refrigerators can connect with the electrical system of the appliance. Using standard ac current produces more predictable ozone production limits variation in ozone production, e.g., due to battery variation. The CPR was connected to a function generator for experiments, so that the power could be controlled and the effect of different levels of power could be determined. An embodiment of the CPR can operate at a single power level and use solid state components, rather than the bulky and more expensive voltage regulator.

To determine the amount of ozone produced by the CPR, the CPR was placed in a sealed chamber (324 cu. inch) that can be connected to an ozone monitor through were Teflon pipes running into the chamber. The experimental refrigerator was modified to allow it to be connected to the ozone analyzer as well. A literature search and preliminary data suggested that 1-10 ppm was sufficient to extend produce life (Glowacz and Rees 2016a; Glowacz and Rees 2016b; Gertzou 2016). In our system, a few minutes of the CPR activation was sufficient to produce at least 100 ppm in the produce drawer or small test chamber. For both ambient shipping and refrigerator use, a single CPR activation per day can be sufficient.

An embodiment can add ozone to atmospheric air surrounding produce at a target concentration of around 0.1 to 10 ppm, depending upon the inactivation and ozone sensitivity parameters for a given spoilage organism, in order for the ozone to kill most microorganisms. Ozone at this concentration also extends produce life and inhibits spoilage due to molds. Ozone also interacts with and decomposes ethylene that many types of fresh products emit, thereby retarding the produce becoming overripe by reducing their exposure to ethylene within the container. In addition, ozone is known to degrade pesticide residues (Swami S et al. 2016). Although ozone treatment kills bacteria and fungi, it is also known to extend produce shelf life. Ozone readily decomposes, leaving no residue.

We evaluated the ability of the CPR to extend the shelf life of produce at room temperature, refrigeration temperature, and to kill or inhibit growth of pathogenic and spoilage microbes. For these studies we used a variety of produce including green beans, strawberries, blueberries, roma tomato, green bell pepper, broccoli vine ripe tomatoes, cucumbers, lettuce and grape tomatoes. Experiments were done at least 3 times for reproducibility and were continued until the treated produce began to visually deteriorate. Different placement of produce within the container showed no effect as long as the produce was not sealed in airtight packaging.

An embodiment of the CPR can be used for GreenBox Testing at room temperature (tested at 21-25° C.). A concentration of at least circa 150 ppm ozone can be used, as increased heat and humidity reduces the efficiency of the technology as compared to refrigerator applications. The container can be treated with ozone each day, and experiments were conducted following this protocol, and produce was placed in a test container at room temperature. The produce was removed daily to take pictures of decomposition; the produce was then placed back in the bins and exposed to ozone. Shelf life varied with different batches of produce, but the shelf life was at least doubled by the ozone in each experiment and in some cases was extended fourfold.

In a similar manner, produce was held in a standard household refrigerator with one refrigerator drawer receiving a target amount of 100 ppm ozone from activating the CPR for less than a few minutes and a second identical drawer kept in an identical refrigerator without the CPR to generate ozone. A separate refrigerator was used as the drawers are not airtight and ozone generated in one drawer could affect produce in the adjacent drawer. In all cases, produce life was extended by refrigeration and the effect of ozone again at least doubled the storage life of the produce. A slightly lower amount of ozone was effective under the refrigerator conditions.

Inactivation of Spoilage Organisms and Human Pathogens by the CPR

We performed microbiologic research where we tested cocktails of bacterial foodborne pathogens and spoilage organisms and cultures of *Salmonella* strains recovered from outbreaks linked to tomatoes. Experiments that require the use of BSL2 pathogens were conducted in approved laboratories under the recommendations of the US Center for Disease Control (CDC) and the University of Florida Environmental Health and Safety division in the Emerging Pathogens Institute laboratories.

Our first trials were with the battery operated CPR. Pure cultures were grown overnight in L-broth and 100 µl of the culture was spread on a non-adsorbent glass or Teflon coupon. The coupon was placed in the test chamber with an CPR and exposed to ozone for different lengths of time. The coupon was then immersed in 5 mL of L-broth and vortex to remove surviving bacteria. Serial dilutions were plated, incubated for 48 hours and plated counts were compared to those of a coupon that was not exposed to the ozone. For experiments with the battery powered CPR, two test coupons were placed in a chamber with the activated CPR for 20 minutes the batteries were disconnected and the chamber left closed for an additional 20 minutes to allow the ozone to reach the maximum amount of impact. The coupons were then processed. This model killed >99% of a variety of Gram-negative bacterial pathogens. As seen in Table 1, counts of these bacterial were all reduced by about 2-logs (99%).

TABLE 1

Counts for the killing experiment with battery operated model

| | Log reduction with 20 minutes exposure | |
|---|---|---|
| Dilution | coupon 1 | coupon 1 |
| Serratia marcescens | 1.5 | 1.7 |
| Xanthamonas | 2.0 | 2.2 |
| Pseudomonas | 2.3 | 2.2 |
| Salmonella enterica | 2.1 | 2.4 |
| E. coli O157 | 2.2 | 2.9 |

An embodiment of the CPR can be powered by the standard electrical grid. We expanded our produce selection to include more products that are typically stored under refrigeration. Daily ozonation of produce, using this set up and running the CPR for a few minutes each day, was shown to significantly increase shelf life of produce. Refrigerated storage has also shown similar efficacy. A single small duration exposure was sufficient to kill up to 99.9% of the highly concentrated, pure bacterial cultures (data not shown). For work with the ac grid powered CPR, we also moved to testing inocula made from inocula from produce purchased at local grocery stores and stored in a refrigerator at 5-8° C. until the produce was visibly spoiled. We worked with three different spoilage inocula. One was a combination of spoiled green beans and grape tomatoes; the second green leaf lettuce and cucumber, and the third was strawberries. The first inoculum was made from approximately 200 g of green beans and 100 g grape tomatoes. The second sample had 200 g each of butter lettuce and cucumber, and the third 200 gm of strawberries. We used a modification of the procedure of Mancinelli et al. The samples were placed in a sterile sample bag with 200 mL of LB broth with 20% glycerol and stomached for 5 minute. The supernatant of each sample was used as the inoculum and aliquots were frozen at −80° C. The standard small duration exposure had limited bactericidal effect. These produce preparations had a rich poly microbial population with both bacteria and fungi present. Three experiments were done with each slurry on coupons as describe above. We also tested a culture of *S. enterica*. A $10^{-2}$ dilution plate for the control and each exposure time from one of the green bean emulsion experiments can be seen in FIG. 11.

A complete microbial work up was not feasible, but the most abundant organisms in the green been sample were *Enterobacter* sp., *Chrysobacter* sp., and an *Aspergillus* sp. The lettuce and cucumber had *Xanthomonas* and *Chromobacter* and the Strawberries has *Fusarium* sp and *Enterobacter* sp. Increasing exposure time to 15 minutes resulted in >99.9% killing drop (Table 2).

TABLE 2

Counts for the Killing Experiments

| Inoculum source | Log reduction with 15 minutes exposure |
| --- | --- |
| Green bean and tomato | 3.6, 6 |
| Lettuce and cucumber | 5.2, 4.8 |
| Strawberry | 6.7 |
| *Salmonella enterica* | 4.2 |

We also wanted to determine if the plasma/ozone exposure contributed to extended storage by inhibiting the growth of spoilage organisms as well as the lethal effects. For these experiments, we used the inocula described above. Exposing inoculated plates, rather than microbes on coupons, to the ozone allows us to see the combined effect of inhibition of growth as well as outright killing of the organisms. The ozone may also be more effective when the organisms are present at a lower concentration that in the overnight cultures.

Duplicate sets of serial 1:0 dilutions of the inoculum were spread on LB plates and one set of plates (without lids) was exposed to ozone by running the CPR in our 324 cubic inch chamber with an input voltage of 25 V and a current of 430-440 mA. For the test plates, the CPR was run for three minutes every day and the chamber was left closed for approximately 24 hours between ozone exposures. The plates were taken out to be photographed and counted each day before the next ozone exposure. Both sets of plates were incubated at room temperature. The control plates were not exposed to ozone. The final plate count was the number after the mold colonies were recognizable at about 4 days. At this point, colonies were stable and not enough time had passed to allow secondary mold colonies to arise from spores. The pH of the L-agar plates remained the same after ozone exposure and the organisms grew normally on plates pre-exposed to ozone, so the inhibitory effects are not due to changes in the agar. All inocula resulted in heavy growth of flora with a mixture of microbes with spore forming mold and Gram-negative bacteria being the most common elements (FIG. 10). The plate counts reached their maximum after 3-4 days growth, with the fungi tacking longer to appear. Only a few minutes per day plasma activation was sufficient to produce a distinct inhibition of growth and/or killing of the organisms. Each experiment was done in triplicate.

TABLE 3

Log reduction after plasma exposure

| Inoculum | CFU log reduction on 3 minute APM exposed plates |
| --- | --- |
| Green bean and tomato | 5.13, 7, 6 |
| Lettuce and cucumber | 6.7, 2.6, 7.7 |
| Strawberry | 6.2 |

The CFU of organisms exposed to plasma was always reduced, usually by more than 5 log, after ozone exposure. We also saw a tendency for mold colonies on the ozone exposed plates to sporulate 24-48 hours later than on the control plates. There was considerable variation in the overall reduction of colony formation.

We have experimented on microbes isolated from rotten green beans, tomatoes, lettuce and cucumbers, and strawberries to observe how much killing/inhibition can be achieved by exposing plates plated with a solution of these vegetables to ozone created by the plasma actuators. Three experiments were performed on each inoculum (except strawberries) and these experiments demonstrated that plasma exposure can successfully inhibit the growth of both bacteria and mold species found in spoiled produce. Moreover, several of these experiments resulted in a greater than 5 log reduction of microbial colonies. It is not yet clear how much of the reduction in spoilage microbes is due to killing and how much is due to inhibition of growth. Colony sizes are identical on plates regardless of exposure. More work will be needed to determine the percentage of isolates killed versus inhibition of growth, but inhibition and killing of microbes appears to be an important component of the plasma/ozone's ability to prolong produce shelf-life.

TABLE 4

CPR Specification Sheet

PHYSICAL CHARACTERISTICS

| Property | Typical value | Unit |
| --- | --- | --- |
| Dimensions | 1.5 × 1.85 × 1.2 | inches |
| Net weight | <50 | g |
| Storage temperature | −40 to 80 | ° C. |
| Operating temperature | −40 to 80 | ° C. |
| Cycles of operation before the DBD electrode requires replacement | >1000* | |
| Cycles of operation with 2 (9 Volt) commercial batteries | >30* | |
| Ozone ($O_3$) emission levels | 120 to 349 | ppm |

TABLE 4-continued

CPR Specification Sheet

ELECTRICAL PROPERTIES

| Property | Typical value | Units |
|---|---|---|
| Input voltage | 25 | V (DC) |
| Input current | 400 | mA (DC) |
| Max. input voltage | 60 | V |
| Max. input current | 1.5 | A |
| Output voltage | 6 | kVpp |
| Operating frequency † | 42 | kHz |

DBD PLASMA ELECTRODE CHARACTERISTICS

| | |
|---|---|
| Overall dimensions | 1.85 × 1.5 inches |
| Dielectric material | hydrocarbon/ceramics composite |
| Dielectric constant | 3.66 @ 8 to 40 GHz |
| Dissipation Factor | 0.0031 |
| Dielectric thickness | 0.030 inches (0.762 mm) |
| Electrode thickness | 1 oz. (35 µm) copper cladding |

*1 cycle equals to 3 minutes of continuous operation.
† Operating frequency may vary slightly according to the plasma electrode design 2) CPR Lifetime—To estimate the life expectancy of an embodiment of the CPR, a module was activated for a few minutes and then turned off for nearly twice that time to simulate a small duration daily activation cycle. This cycle was repeated several times. The chamber was flushed with room air between cycles. After every 30 runs the ozone was measured. The run parameters were 25V, 385 mA. As shown in Table 5 (below), the device ran for at least 120 cycles. The ozone concentration after an activation run varied between 120 and 349 (this corresponds to approximately 4 months and 1 year of operation, respectively), consistent with what we saw for runs of multiple new CPRs, but with no clear evidence of loss of function.

TABLE 5

Ozone Production After Initial and Every 30 Cycles

| # of Runs | Ozone ppm |
|---|---|
| 1 | 315 |
| 30 | 236 |
| 60 | 120 |
| 90 | 349 |
| 120 | 215 |

The data suggests the reactor can be used for at least 4-6 months assuming it is turned on once a day. The weakest part of this reactor is its electrodes which may erode over time.

Traditional Ozone generators that could be used for food containers are bulky, consume high levels of battery power or require AC power to operate. An embodiment of the invention can incorporate a very low cost CPR printed circuit board assembly with integrated battery and data logger chip. The CPR can be recycled, or disposed of after shipment. The CPR can be placed on top of the shipment contents, or other location within the tote, just before the tote is closed. The CPR can switch on and off as needed and operate over the entire distribution chain. An inexpensive RFID data logger can be added on the CPR printed circuit board design. The RFID chip can store basic environmental and quality control parameters and can be read by a standard handheld RFID reader. The CPR can be read in place, before or after the tote is opened, or removed and read when the customer opens the tote. The CPR can be removed, reset, recycled and/or disposed as needed.

Example—Greenbox

One embodiment of the present invention is to decontaminate air and surfaces employing an integrated plasma generating circuitry inside of a partially sealed, or completely sealed, container via diffuse electrical plasma generated in atmospheric air, such as an environment originally of atmospheric air and which is ozonated with some time cycle. This is accomplished by applying a potential difference between two electrodes, separated by an insulating dielectric layer. An embodiment of the GreenBox system consists of a container with integrated circuitry, an external power supply, a disposable plasma actuator, and a timer.

Description of Operation

Vegetables and other perishables, including but not limited to nuts, seeds, grains, fruits, pastries including dairy based pastries can be added to an embodiment of the GreenBox system, to help extend their shelf life as compared to open air or refrigeration alone. The box is intended for home use, transportation, or retail. It can be used in a refrigerated environment and the full operational range is defined in the Data Sheet.

Perishables are added to (e.g., placed in) the box, the box is then closed, and the ozone producing system can be turned on, or operated, according to a desired time cycle. In an embodiment the user can turn the system on with the switch on the power supply. Optimal time to fill the container with ozone is 5-15, 6-14, 7-13, 8-12, 9-11, and/or approximately 10 minutes. After this time, the user can turn the system off Before opening the container, to ensure most of the ozone has decomposed to oxygen and that the ozone has had a change to have an effect on microbes and ethaline, the user should wait for a "working period" of 40-80, 5-70, 55-65, and/or about 60 minutes. After this time period, e.g., 60 minute period, the ozone levels drop to below the NIOSH recommended exposure limit of 0.1 PPM. The period is longer if the unit is used in temperatures below a temperature of 20 Celsius.

One of the benefits of the green box design is that it does not require continuous operation of the plasma electrode. Our numerous tests have demonstrated that running the plasma circuit for only a few minutes a day is enough to halt the reproduction of bacteria and insect pests and prolong the life of produce and grain. Therefore, a time controlling module is added to the green box to operate the plasma electrode in a particular interval of time during day/night. This mechanism increases the lifespan of the GreenBox system, reduces energy consumption and regulates ozone to safety levels when the box is open. The timer component of the system will have a clock with which the user can set the time of day they wish the unit to activate. The system can activate at the same time every day, say middle of the night when access to the perishables is not necessary. A light will indicate when the system is running, when it is in its "working period", and when it is appropriate to open. FIG. 2 shows a maximum ozone concentration in a 3 cubic foot box, the time to reach that concentration, and the time for the ozone to decay to lower concentrations. A system diagram is shown in FIG. 1.

To further ensure safe handling, other iterations include a switch that does not allow the user to turn the system on unless the lid is closed.

In a specific embodiment, the GreenBox system consists of the container with integrated circuitry, an integrated control timer, external power supply, an actuator module, and disposable plasma actuators. A module in which the actuator is inserted to be powered is the only thing exposed in the box. A shield on the actuator can let air out but keep the circuit from short circuiting via wet surface contact.

The box interior can be constructed of ozone resistant plastic or lined with an ozone resistive coating. The box insulates the perishables when the box is being transported or used outside of room temperature conditions. Similar to a cooler, the box consists of two layers of plastic filled with insulating foam. A hinged top can be opened, closed and latched shut. The top is air-tight to keep ozone from escaping during operation. An air tight seal is achieved with an ozone resistive gasket lining the top and box that forms a seal when the top is brought down and latched closed. The top will pivot on two hinges and can be kept shut with two latches. Integrated inside one of the small upright walls of the cooler will be the plasma generating circuitry (position shown in FIG. 4 and FIG. 5). The circuitry is inaccessible and thermally and electrically insulated inside of the wall. Materials such as Silicone and thermally insulating sheets are used to this end. There is a small DC jack input on the outside of the box on the same wall as the circuitry (FIG. 2). This is where the power supply is plugged in and subsequently unplugged for easy transportation. The box remains plugged in while the cycle is running but may be moved when in cool down mode. Wires lead from this port to the circuit through the interior of the wall. The output of the circuitry is fed out of the wall (interior of the box) and attached to the actuator module which itself is affixed to the wall (FIG. 4). Other sets of wires lead from the circuitry to the programmable timer which is located on the wall adjacent to the circuit and actuator module (FIG. 3). An LED indicator is located above the timer and will signal to the user if the system is ready to use, when the system is in use and when it is not advisable to open.

In one embodiment, the box contains a fan unit which in operation circulates ozone within the box. Another embodiment contains a fan and catalytic ozone scrubber located on a wall of the box. This ozone scrubber pulls air out of the interior volume of the box and passes it through a metallic catalyst capable of reducing the ozone into oxygen before it reaches the exterior of the box. The ozone scrubber module is located near the bottom of the wall where the ozone concentration is highest from settling. The ozone scrubber will use replicable catalyst cartridges.

A specific embodiment relates to the CPR shown in FIGS. 10, 11, and 12, and incorporates the circuitry shown in FIGS. 23 and 24, operated as follows:

Parameters:

Output AC voltage: An embodiment of the CPR supplies a voltage of approximately 6 kVpp to produce plasma. Depending on the dielectric material of the plasma reactor or if the CPR is an arrangement, it is possible to supply other values of the output AC voltages, which can range from 1 kVpp to 50 kVpp.

Output Current: An embodiment of the CPR embodiment supplies an output AC current in the order of µA. Depending on different modifications and if they are connected in arrays, the output AC current could range in the range 1 µA to 1 A.

Input DC Voltage: The current CPR consumes an input DC voltage of 25 V. However, the input voltage can vary in a range of 10 to 60 V.

Input DC Current: The CPR prototype requires a DC input current of 400 mA for activation. However, other versions of this could consume an input DC current in ranger of 100 mA to 10 A or more.

Operating Frequency: 1 kHz to 300 kHz.

Size: the size of CPR embodiment is a stack with dimensions A×B×C. (0.1 mm<A,B,C<100 mm). In addition, the circuit can be separated into different modules that can be arranged in a 2-dimensional fashion.

Aspects of the invention may be described in the general context of computer-executable instructions, such as program modules, being executed by a computer. Generally, program modules include routines, programs, objects, components, data structures, etc., that perform particular tasks or implement particular abstract data types. Moreover, those skilled in the art will appreciate that the invention may be practiced with a variety of computer-system configurations, including multiprocessor systems, microprocessor-based or programmable-consumer electronics, minicomputers, mainframe computers, and the like. Any number of computer-systems and computer networks are acceptable for use with the present invention.

Specific hardware devices, programming languages, components, processes, protocols, and numerous details including operating environments and the like are set forth to provide a thorough understanding of the present invention. In other instances, structures, devices, and processes are shown in block-diagram form, rather than in detail, to avoid obscuring the present invention. But an ordinary-skilled artisan would understand that the present invention may be practiced without these specific details. Computer systems, servers, work stations, and other machines may be connected to one another across a communication medium including, for example, a network or networks.

As one skilled in the art will appreciate, embodiments of the present invention may be embodied as, among other things: a method, system, or computer-program product. Accordingly, the embodiments may take the form of a hardware embodiment, a software embodiment, or an embodiment combining software and hardware. In an embodiment, the present invention takes the form of a computer-program product that includes computer-useable instructions embodied on one or more computer-readable media.

Computer-readable media include both volatile and nonvolatile media, transitory and non-transitory, transient and non-transient media, removable and nonremovable media, and contemplate media readable by a database, a switch, and various other network devices. By way of example, and not limitation, computer-readable media comprise media implemented in any method or technology for storing information. Examples of stored information include computer-useable instructions, data structures, program modules, and other data representations. Media examples include, but are not limited to, information-delivery media, RAM, ROM, EEPROM, flash memory or other memory technology, CD-ROM, digital versatile disks (DVD), holographic media or other optical disk storage, magnetic cassettes, magnetic tape, magnetic disk storage, and other magnetic storage devices. These technologies can store data momentarily, temporarily, or permanently.

The invention may be practiced in distributed-computing environments where tasks are performed by remote-processing devices that are linked through a communications network. In a distributed-computing environment, program modules may be located in both local and remote computer-storage media including memory storage devices. The computer-useable instructions form an interface to allow a computer to react according to a source of input. The instructions cooperate with other code segments to initiate a variety of tasks in response to data received in conjunction with the source of the received data.

The present invention may be practiced in a network environment such as a communications network. Such networks are widely used to connect various types of network elements, such as routers, servers, gateways, and so forth. Further, the invention may be practiced in a multi-network environment having various, connected public and/or private networks.

Communication between network elements may be wireless or wireline (wired). As will be appreciated by those skilled in the art, communication networks may take several different forms and may use several different communication protocols. And the present invention is not limited by the forms and communication protocols described herein.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

REFERENCES

1. Glowacz M, Rees D. Exposure to ozone reduces postharvest quality loss in red and green chili peppers. Food Chem. 2016; 210:305-10
2. Glowacz M, Rees D. The practicality of using ozone with fruit and vegetables. J Sci Food Agric. 2016; 96:4637-43
3. Gertzou I N, Drosos P E, Karabagias I K, Riganakos K A. Combined effect of ozonation and packaging on shelf life extension of fresh chicken legs during storage under refrigeration. J Food Sci Tech. 2016; 53:4270-4277
4. http://www.microbeworld.org/index.php?option=com_jlibrary&view=article&id=6401
5. Mancinelli R L, McKay C P. Effects of nitric oxide and nitrogen dioxide on bacterial growth. Appl Environ Microbiol. 1983; 46:198-202
6. Mastanaiah, N., Johnson, J. A., Roy, S. Effect of Dielectric and Liquid on Plasma Sterilization using Dielectric Barrier Discharge Plasma. *PLoS One* 8(8): e70840 (2013)
7. Mastanaiah, N., Banerjee, P., Johnson, J. A., Roy, S. Examining the role of Ozone in Surface Plasma Sterilization using Dielectric Barrier Discharge Plasma. Plasma Process Polymers (Cover Article), 2013; 10:1120-1133
8. Swami S, Muzammil R, Saha S, Shabeer A, Oulkar D. Banerjee K, Singh S B. Evaluation of ozonation technique for pesticide residue removal and its effect on ascorbic acid, cyanidin-3-glucoside, and polyphenols in apple (*Malus domesticus*) fruits. Environ Monit Assess. 2016; 188:301
9. Zelaya A J, Stough G, Rad N, et al. *Pseudomonas aeruginosa* Biofilm inactivation: Decreased cell culturability, adhesiveness to surfaces, and biofilm thickness upon high-pressure nonthermal plasma treatment. IEEE Trans Plasma Sci IEEE Nucl Plasma Sci Soc. 2010; 38:3398-3403

The invention claimed is:

1. A power supply system, comprising:
    a power amplifier configured to connect to a load,
    wherein the power amplifier comprises:
        a transformer; and
        an inductor,
        a variable capacitor in parallel with a transistor,
        wherein when the power amplifier is connected to the load, the transformer is connect to the load, and the power amplifier is configured to:
            receive a supply voltage; and
            output a supply power to the load at an operating frequency;
        wherein an inductance value of the inductor and a capacitance value of the variable capacitor are set based on a resonance frequency of the transformer connected to the load, and
        wherein the variable capacitor is configured to be adjusted to tune the capacitance value of the variable capacitor to adjust an impedance of the power amplifier when an impedance of the load changes.
2. The power supply system of claim 1, further comprising:
    a variable function generator configured to provide the supply voltage to the power amplifier.
3. The power supply system of claim 1, further comprising:
    a flat planar circuit board layer,
    wherein the load and the power amplifier are integrated on the flat planar layer.
4. The power supply system of claim 1, further comprising:
    a controller configured to control the supply voltage.
5. The power supply system of claim 4,
    wherein the supply voltage is supplied in a duty cycle.
6. The power supply system of claim 4, further comprising:
    feedback circuitry configured to monitor an operational parameter of the load and provide feedback to the controller,
    wherein the controller is configured to control operation of the power amplifier based on the provided feedback.
7. The power supply system of claim 6,
    wherein the feedback circuitry comprises:
        a moisture sensor configured to detect moisture on an active surface of a plasma actuator,
    wherein the load comprises the plasma actuator.
8. The power supply system of claim 6,
    wherein the feedback circuitry comprises:
        an air speed sensor configured to determine a speed of airflow over an active surface of a plasma actuator,
    wherein the load comprises the plasma actuator.
9. The power supply system of claim 1,
    wherein the variable capacitor comprises a capacitor matrix component.
10. The power supply system of claim 1, wherein the power supply has a vertically stacked structure comprising multiple circuit board layers, and
    wherein the load is integrated on a top circuit board layer circuit layers and the power amplifier is integrated on a lower circuit board layer of the multiple circuit board layers.
11. A method comprising:
    interconnecting a power supply system and a load,
    wherein the power supply system comprises:
        a power amplifier,
    wherein the power amplifier comprises:
        a transformer;
        an inductor; and
        a variable capacitor in parallel with a transistor,
    wherein an inductance value of the inductor and a capacitance value of the variable capacitor are set based on a resonance frequency of the transformer connected to the load;

receiving, at the power amplifier, a supply voltage;

outputting, via the power amplifier, a supply power to the load at an operating frequency; and adjusting a capacitance value of the variable capacitor to adjust an impedance of the power amplifier when an impedance of the load changes.

12. The method of claim 11, further comprising:

monitoring an operational parameter of the load and providing feedback to a controller; and controlling, via the controller, operation of the power amplifier based on the feedback.

13. The method according to claim 11, further comprises:

generating ozone, wherein generating ozone comprises driving the load with the power supply system.

14. The method according to claim 13, monitoring an operational parameter of the load and providing feedback to a controller; and controlling, via the controller, operation of the power amplifier based on the feedback.

15. The method according to claim 13, wherein the load comprises at least one pair of electrodes separated by a dielectric medium.

16. The method according to claim 13, wherein the power supply system is embedded in a wall with respect to which the load is positioned.

17. The method according to claim 13, wherein the power supply system is horizontally or vertically stacked to lit within two cubic inch space, and wherein the ozone deodorizes, sterilizatizes, and/or decontaminates a region in which the ozone is generated.

18. The method according to claim 17, wherein a shelf life of a fruit and/or vegetable in the region is extended by over 100%, with or without refrigeration.

* * * * *